(12) United States Patent
Usta et al.

(10) Patent No.: US 8,878,169 B2
(45) Date of Patent: Nov. 4, 2014

(54) PHOTOCURABLE POLYMERIC MATERIALS AND RELATED ELECTRONIC DEVICES

(71) Applicant: Polyera Corporation, Skokie, IL (US)

(72) Inventors: Hakan Usta, Evanston, IL (US); Huei Shuan Phoebe Tan, Zhubei (TW); Yu Xia, Shokie, IL (US); Zhihua Chen, Skokie, IL (US); Yan Zheng, Skokie, IL (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 57 days.

(21) Appl. No.: 13/796,017

(22) Filed: Mar. 12, 2013

(65) Prior Publication Data

US 2013/0200345 A1  Aug. 8, 2013

Related U.S. Application Data

(63) Continuation of application No. PCT/US2013/025000, filed on Feb. 6, 2013.

(60) Provisional application No. 61/596,217, filed on Feb. 7, 2012.

(51) Int. Cl.
| | |
|---|---|
| H01L 29/08 | (2006.01) |
| H01L 51/05 | (2006.01) |
| C08F 220/28 | (2006.01) |
| H01L 51/10 | (2006.01) |
| C08F 220/30 | (2006.01) |

(52) U.S. Cl.
CPC .......... *H01L 51/0512* (2013.01); *H01L 51/052* (2013.01); *H01L 51/0541* (2013.01); *C08F 220/28* (2013.01); *H01L 51/107* (2013.01); *C08F 220/30* (2013.01); *H01L 51/0545* (2013.01)
USPC .............................................. 257/40; 438/82

(58) Field of Classification Search
USPC .............................................. 257/40; 438/82
See application file for complete search history.

(56) References Cited

U.S. PATENT DOCUMENTS

| | | | |
|---|---|---|---|
| 6,232,157 B1 * | 5/2001 | Dodabalapur et al. | 438/158 |
| 2007/0129473 A1 * | 6/2007 | Shin et al. | 524/261 |
| 2007/0259278 A1 * | 11/2007 | Kura et al. | 430/7 |
| 2008/0067503 A1 | 3/2008 | Kim et al. | 257/40 |
| 2011/0218266 A1 * | 9/2011 | Studer et al. | 522/8 |
| 2012/0092598 A1 * | 4/2012 | Kyrlidis et al. | 349/106 |
| 2012/0292626 A1 | 11/2012 | Yahagi | 257/59 |

FOREIGN PATENT DOCUMENTS

| | | |
|---|---|---|
| GB | 1314689 | 4/1973 |
| JP | 2007219463 | 8/2007 |
| JP | 2007256886 | 10/2007 |

OTHER PUBLICATIONS

Tanaka et al: "Photoreversible Reactions of Polymers Containing Cinnamylideneacetate Derivatives and the Model Compounds", *J. Pol. Sci.*, 15: 2685-2689 (1977).

(Continued)

*Primary Examiner* — Douglas Menz
(74) *Attorney, Agent, or Firm* — Karen K. Chan

(57) ABSTRACT

Disclosed are photocurable polymers that can be used as active and/or passive organic materials in various electronic, optical, and optoelectronic devices. In some embodiments, the device can include a dielectric layer prepared from such photocurable polymers. In some embodiments, the device can include a passivation layer prepared from the polymers described herein.

20 Claims, 4 Drawing Sheets

Organic material of the present teachings

(56) References Cited

OTHER PUBLICATIONS

Roucoux et al.: "Photochemistry of Polymeric Systems. III. Photocrosslinking of Polymers and Copolymers Including Cyanocinnamylydene-Pyridinium Groups", *J. Applied Pol. Sci.*, 26: 1221-1232 (1981).

Mandal et al.: "Thin Film Processing of NLO Materials, VII A New Approach to Design of Cross-Linked Second-Order Nonlinear Optical Polymers", *Syn. Metals*, 41-43: 3143-3150 (1991).

* cited by examiner a)

b)

a)  b)

PHOTOCURABLE POLYMERIC MATERIALS AND RELATED ELECTRONIC DEVICES

CROSS REFERENCE TO RELATED APPLICATIONS

This application is a continuation of International Application No. PCT/US2013/025000, filed on Feb. 6, 2013, which claims priority to and the benefit of U.S. Provisional Patent Application Ser. No. 61/596,217, filed on Feb. 7, 2012, the disclosure of each of which is incorporated by reference herein in its entirety.

INTRODUCTION

In the past decade, there has been a growing interest in developing electronic devices using organic or (amorphous) metal oxide materials as the semiconductor component. These devices can offer advantages such as structural flexibility, potentially much lower manufacturing costs, and the possibility of low-temperature ambient manufacturing processes on large areas. For example, both organic and (amorphous) metal oxide materials can be used to enable new devices such as electronic paper, flexible liquid crystal display panels, flexible organic light-emitting diodes (OLEDs), and radio-frequency identification (RFID) technologies.

One of the key benefits of using organic and (amorphous) metal oxide materials is the potential to deposit the corresponding films via solution-phase deposition techniques, although both can be deposited using various vapor-phase approaches. Yet, to fully realize the processing advantages of organic or (amorphous) metal oxide semiconductors, all active components of the device should be mechanically flexible and preferably, most of the components of the device should be compatible with, if not processable by, solution-phase deposition methods.

For example, thin-film transistors (TFTs) based upon various solution-processed organic semiconductors as well as solution-processed or vapor-deposited metal oxide semiconductors have been developed. However, a critical component in TFTs is the dielectric layer, which serves as the gate electrical insulator material. Specifically, one of the challenges for the successful commercialization of these semiconductor transistors relates to what is known as the gate bias stress effects. The gate bias stress effects can be understood as follows. In a transistor, there are typically three electrodes, serving as gate, source, and drain. The gate electrode supplies the controlling voltage to the transistor, and the semiconductor channel of the transistor conducts current from the source to the drain in response to the gate voltage. The gate dielectric of a TFT electrically insulates the gate from the semiconductor channel. Superior performance in a TFT requires a high channel conductance, fast "on" and "off" responses to the applied gate voltage, a very rapid increase and decrease in the source-to-drain current as the gate voltage rises and falls past a threshold switching value, minimal current leakage from the source to the drain in the absence of an applied gate voltage and negligible current leakage from the channel to the gate. These operating characteristics should be stable, and should not change or drift after a long period of applied gate voltage. In reality, switching a TFT on for some time often leads to a reduction in current at a given gate voltage (mobility reduction), current-voltage hysteresis, and/or a variation of the turn-on characteristics (threshold voltage shift). Therefore, gate bias stress usually is studied by applying a fixed gate voltage for an extended time, followed by a measurement of the transfer curve characteristic. The causes of gate bias stress effects are not completely understood, but a contributing factor is believed to be the trapping and release of charge carriers on a time scale comparable to the measurement time. Also, it is believed that water in the dielectric-semiconductor interface can cause gate bias stress effects.

Thus, the gate dielectric material plays a critical role in determining the performance of a TFT. In general, a thinner gate dielectric layer leads to a greater voltage gradient across the gate dielectric layer, and this in turn leads to the more rapid generation of more charge carriers in the semiconductor, and permits a reduction in driving voltage. However, the properties of the gate dielectric material set a limit on how thin this layer can be. For example, the material must not break down and conduct current under the influence of the voltage gradient; it must adhere well to the semiconductor channel material; it must be physically robust enough to withstand thermal cycling without fracturing or separating from the various materials to which it is bonded; and it must exhibit stable properties under extended application of a gating voltage. Furthermore, to be commercially feasible, the dielectric material should be processable using methods that are compatible with existing microfabrication technology, and preferably, via solution-phase processes as described above. For display applications that rely on pixel-by-pixel modulation of light emitted by a backlight, the gate dielectric materials preferably also are flexible and transparent.

Accordingly, there is a desire in the art for new dielectric materials which can meet one or more of the requirements above.

SUMMARY

In light of the foregoing, the present teachings provide organic materials that possess one or more desirable properties and characteristics such as resistance against gate bias stress, high electrical breakdown strength, and low-leakage properties, making them suitable as gate dielectric materials in a transistor device. Certain desirable properties and characteristics of the present organic materials such as air and water stability and photocrosslinkability at low dosage and improved speed also make them suitable as barrier/passivation or photoresist materials.

More specifically, the present organic materials are based upon a crosslinked matrix of a polymer having a first repeating unit of Formula (Ia) and optionally a second repeating unit of Formula (Ib):

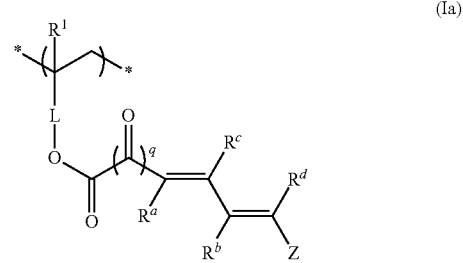

(Ib)

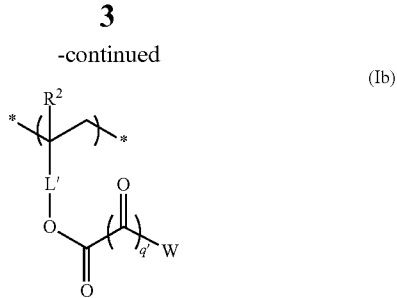

wherein $R^1$, $R^2$, $R^a$, $R^b$, $R^c$, $R^d$, L, L', W, Z, q and q' are as defined herein. The polymer described herein can be solution-deposited then subsequently cured into physically robust and ambient-stable thin films with various desirable properties. The present teachings also relate to various electronic devices that include a field-effect transistor having a semiconductor layer comprising a semiconducting electronic material, a dielectric layer comprising an insulating electronic material, and source, drain, and gate electrodes each comprising a conducting electronic material, and further the organic material described herein, where the organic material either can be incorporated as an insulating electronic material within the dielectric layer or the organic material can be in contact with at least one of the electronic materials.

The foregoing as well as other features and advantages of the present teachings will be more fully understood from the following figures, description, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
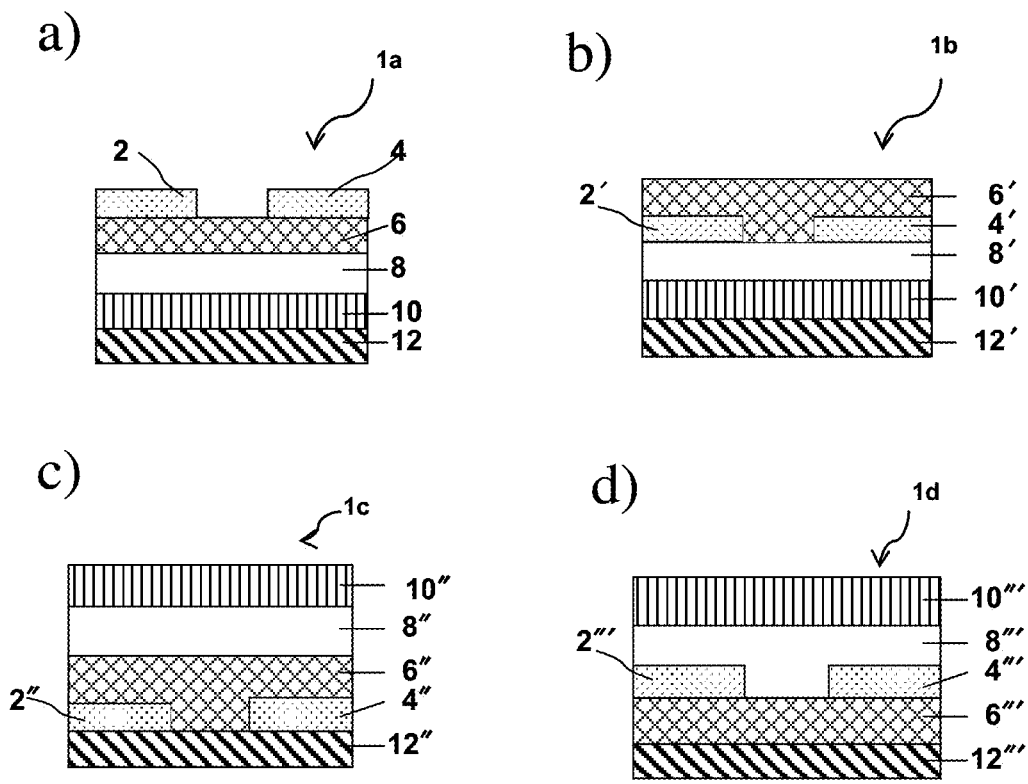
FIG. 1 illustrates four different configurations of thin film transistors: a) bottom-gate top contact, b) bottom-gate bottom-contact, c) top-gate bottom-contact, and d) top-gate top-contact; each of which can be used to incorporate one or more linear polymers of the present teachings as active and/or passive materials.

The present teachings relate to organic materials that can be used as active and/or passive materials in a wide variety of electronic, optical, and optoelectronic devices such as thin film transistors (TFTs), specifically, organic field-effect transistors (OFETs), semiconductor oxide field-effect transistor (SOFETs), as well as sensors, capacitors, unipolar circuits, complementary circuits (e.g., inverter circuits), and the like.

Generally, the present organic materials are prepared from a polymer having a first repeating unit including a diene moiety (e.g., —$CR^a$=$CR^c$—$CR^b$=$CR^d$—) in the side chain, where the polymer can be cured at a lower curing dose and/or within shorter curing time, yet the resulting crosslinked product can exhibit improved electronic and/or physical properties compared to known photocurable materials.

More specifically, the polymer described herein can be solution-processed into thin films, where the thin films subsequently can be cured photochemically, and optionally thermally, into physically robust and ambient-stable active or passive materials suitable for use in various electronic, optical, and optoelectronics devices. For example, the organic materials according to the present teachings can be used (either by itself or with at least one other dielectric material) as the dielectric layer in a thin film transistor, as an etch-stop/photoresist/blocking/passivation/encapsulation/barrier material (for example, to encapsulate the source and drain electrodes in a transistor), or as an interfacial material (for example, a surface-modifying interlayer).

When used as a dielectric material, the present organic materials can exhibit a wide range of desirable properties and characteristics including, but not limited to, low leakage current densities, high breakdown voltages, low hysteresis, tuned capacitance values, uniform film thickness, solution-processability, fabricability at low temperatures and/or atmospheric pressures, air and moisture stability, and/or compatibility with diverse gate materials and/or semiconductors. When used as passivation or interfacial materials, the present organic materials can exhibit desirable properties and characteristics including, but not limited to, photocrosslinkability at low dosage and/or increased speed, high glass transition temperature, high optical clarity, low shrinkage, low moisture absorption, low oxygen penetration, adhesion, uniform film thickness, solution-processability, fabricability at low temperatures and/or atmospheric pressures, and good adhesion to adjacent materials.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), butyl (e.g., n-butyl, iso-butyl, sec-butyl, tert-butyl), and hexyl groups. In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_zH_{2z+1-t}X^0_t$, where $X^0$, at each occurrence, is F, Cl, Br or I, z is an integer in the range of 1 to 40, and t is an integer in the range of 1 to 81, provided that t is less than or equal to 2z+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cyclic" refers to an organic closed-ring group including cycloalkyl groups, aryl groups, cycloheteroalkyl groups, and heteroaryl groups as defined herein.

As used herein, "cycloalkyl" refers to a non-aromatic carbocyclic group including cyclized alkyl, cyclized alkenyl, and cyclized alkynyl groups. In various embodiments, a cycloalkyl group can have 3 to 40 carbon atoms (i.e., $C_{3-40}$ cycloalkyl group), for example, 3 to 20 carbon atoms. A cycloalkyl group can be monocyclic (e.g., cyclohexyl) or polycyclic (e.g., containing fused, bridged, and/or spiro ring systems), where the carbon atoms are located inside the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 40 ring atoms (i.e., 3-40 membered cycloheteroalkyl group), for example, 3 to 20 ring atoms. One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 40 carbon atoms in its ring system, which can include multiple fused rings. In some embodiments, a polycyclic aryl group can have from 8 to 40 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 40 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

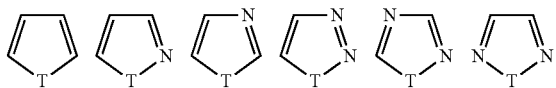

-continued

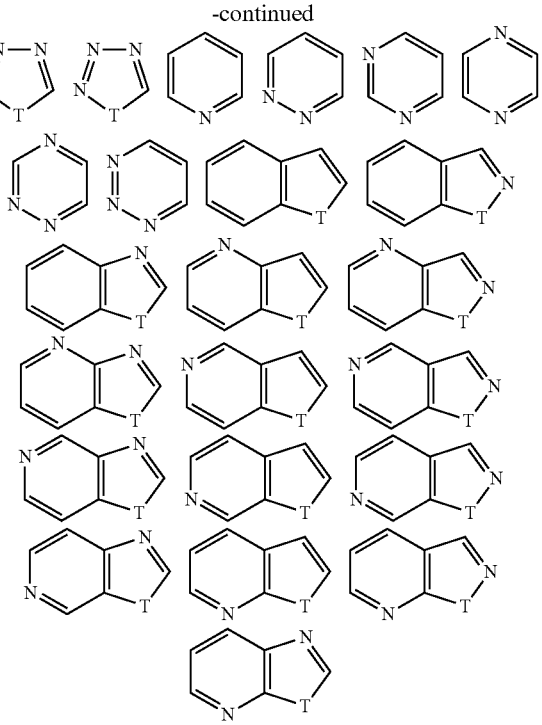

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

At various places in the present specification, substituents on a chemical group are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, a "dielectric material" has a conductivity in the order of $10^{-6}$ Scm$^{-1}$ or less to avoid current leakage to an adjacent electrical conductor.

It will be understand that when two components are described as being coupled to each other, the two components can be directly in contact (e.g., directly coupled to each other), or the two components can be coupled to each other via one or more intervening components or layers.

The present polymers include a first repeating unit of Formula (Ia) and optionally a second repeating unit of Formula (Ib):

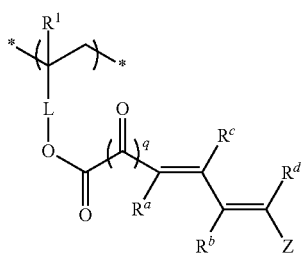

(Ia)

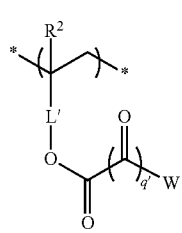

(Ib)

wherein:
L and L' independently are absent or a divalent linker;
W is selected from $-(CR^{a'}=CR^{c'})_{p'}-(CR^{b'}=CR^{d'})_{p'}-Z'$,
Z is selected from a $C_{1-10}$ alkyl group, a $C_{1-10}$ haloalkyl group, a substituted or unsubstituted $C_{6-14}$ aryl group, and a substituted or unsubstituted 5-14 membered heteroaryl group;

Z' is selected from H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group;

R$^1$ and R$^2$ independently are H or CH$_3$;

R$^a$, R$^{a'}$, R$^b$ and R$^{b'}$ independently are selected from H, F, Cl, CN, CH$_3$, and CF$_3$;

R$^c$, R$^{c'}$, R$^d$ and R$^{d'}$ independently are selected from H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group;

p and p' independently is 0 or 1; and q and q' independently is 0 or 1.

When present, the linkers L and L' can be various hydrolytically stable divalent organic groups. For example, L and L' can be selected from a divalent phenyl group ($-C_6H_5-$), $-Y-$, and $-C(O)O-Y-$, wherein Y can be selected from a divalent $C_{1-10}$ alkyl group and a divalent $C_{1-10}$ haloalkyl group.

Thus, in various embodiments, the first repeating unit of formula (Ia) can be selected from:

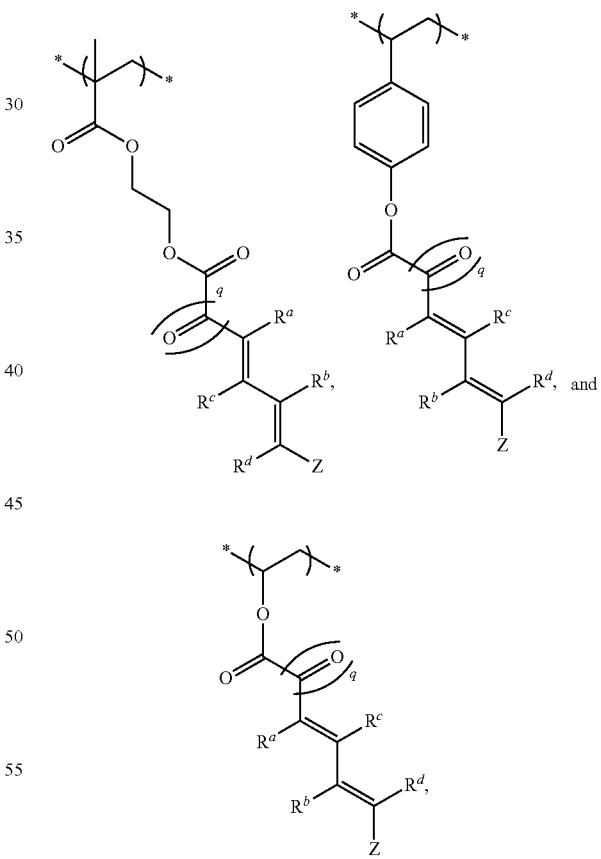

wherein R$^a$, R$^b$, R$^c$, R$^d$, Z and q are as defined herein.

In preferred embodiments, Z can be an unsubstituted or substituted $C_{6-14}$ aryl or 5-14 membered heteroaryl group. For example, Z can be a phenyl, naphthyl, or anthracenyl group optionally substituted with 1-5 groups independently selected from a halogen, CN, R$^e$, $-O-R^e$, $-S-R^e$, $-C(O)-R^e$, and $-C(O)-O-R^e$, wherein R$^e$, at each occurrence, is selected from a $C_{1-10}$ alkyl group, a $C_{1-10}$ haloalkyl group, a $C_{2-10}$ alkenyl group, and a $C_{2-10}$ alkynyl group. In other preferred embodiments, Z can be an unsubstituted 5- or 6-membered heteroaryl group or a 5- or 6-membered heteroaryl group substituted with 1-5 groups independently selected from a halogen, CN, oxo, $R^e$, —O—$R^e$, —S—$R^e$, —C(O)—$R^e$, and —C(O)—O—$R^e$, wherein $R^e$, at each occurrence, is selected from a $C_{1-10}$ alkyl group, a $C_{1-10}$ haloalkyl group, a $C_{2-10}$ alkenyl group, and a $C_{2-10}$ alkynyl group. Examples of 5- or 6-membered heteroaryl groups include, without limitation, pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, and oxadiazolyl groups. In yet other preferred embodiments, Z can be an unsubstituted 5-6 bicyclic heteroaryl group or a 5-6 bicyclic heteroaryl group substituted with 1-5 groups independently selected from a halogen, CN, oxo, $R^e$, —O—$R^e$, —S—$R^e$, —C(O)—$R^e$, and —C(O)—O—$R^e$, wherein $R^e$, at each occurrence, is selected from a $C_{1-10}$ alkyl group, a $C_{1-10}$ haloalkyl group, a $C_{2-10}$ alkenyl group, and a $C_{2-10}$ alkynyl group. Examples of 5-6 bicyclic heteroaryl groups include, without limitation, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, and thienoimidazolyl groups.

To illustrate, the first repeating unit of Formula (Ia) can be selected from:

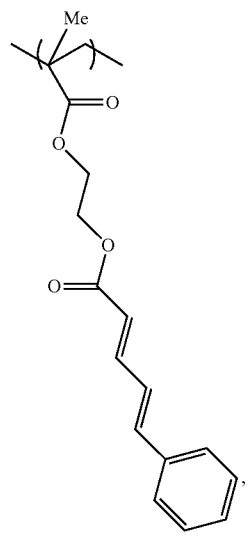
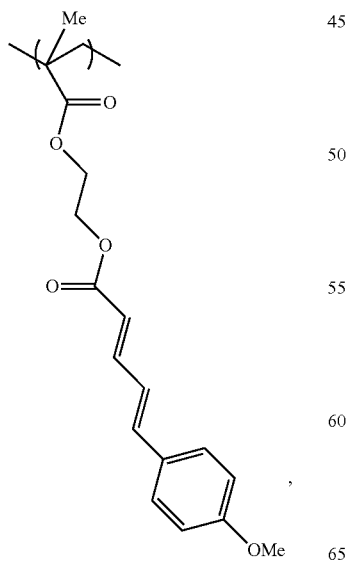
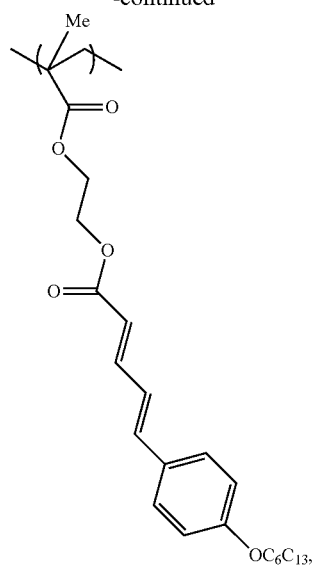
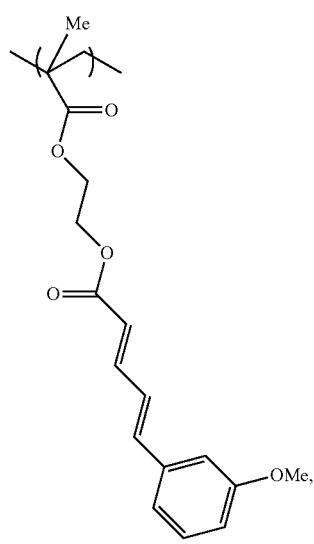
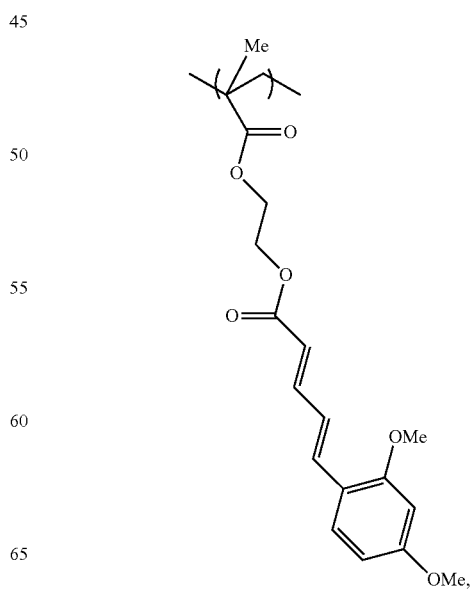

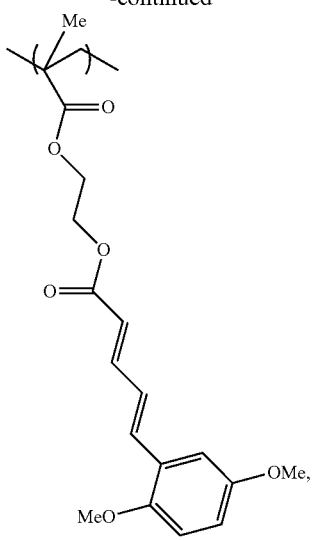
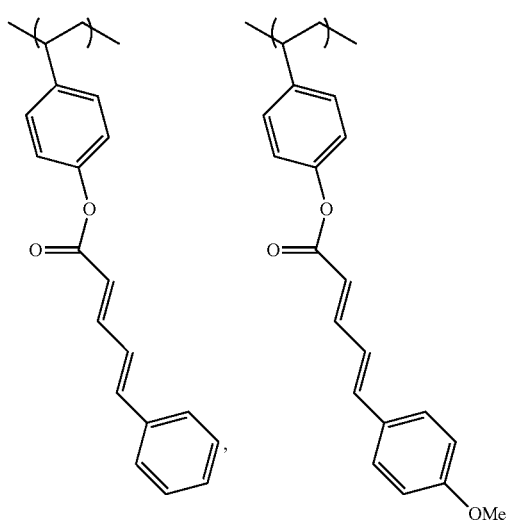
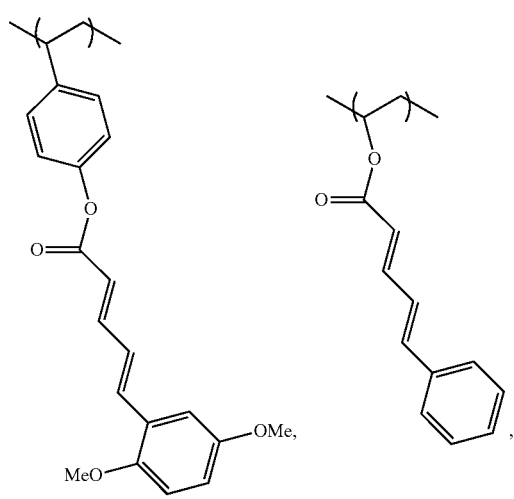
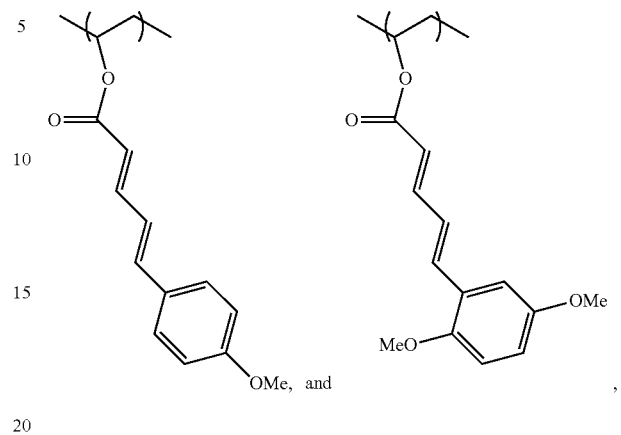
when q=0.
In particular embodiments, $R^a$ can be CN. For example, the first repeating unit of Formula (Ia) can be selected from:
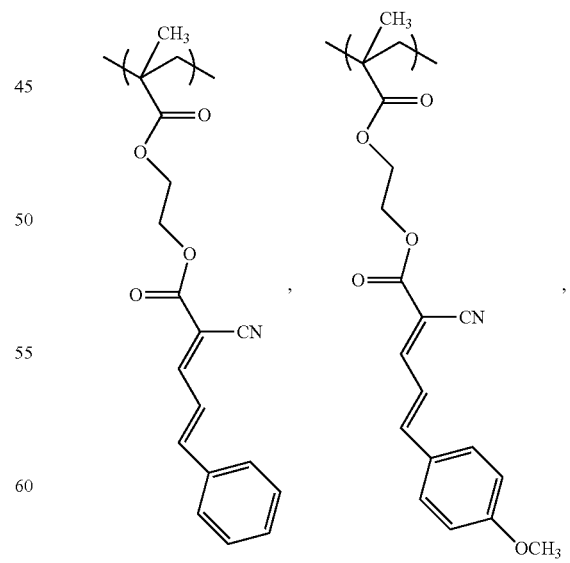

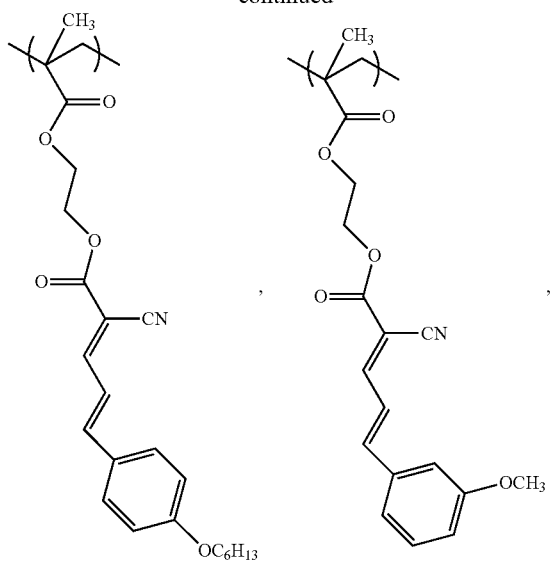
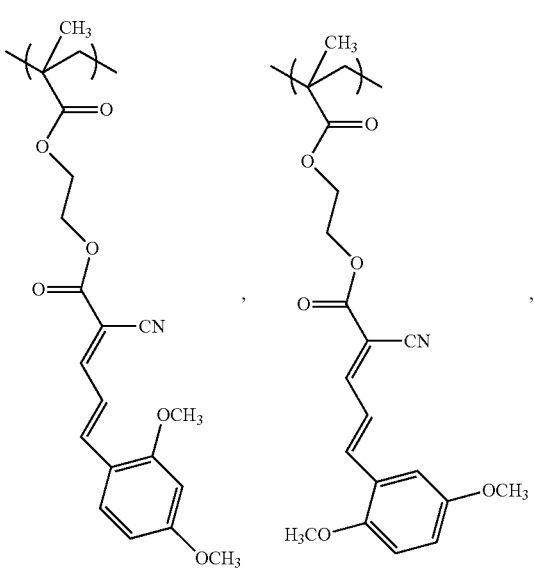
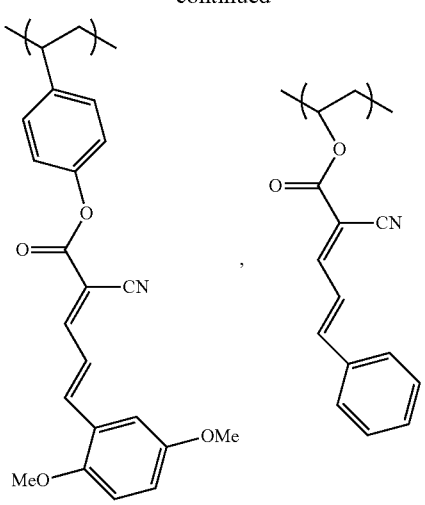
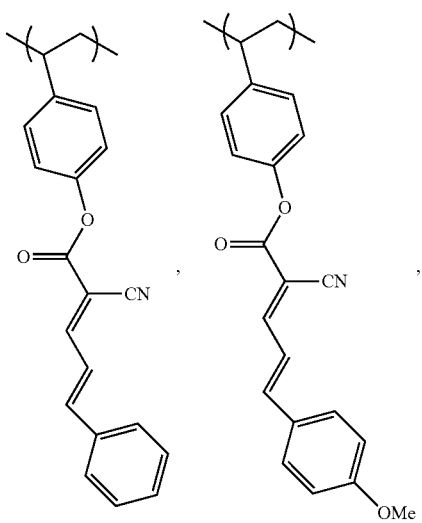
To illustrate further, the first repeating unit of Formula (Ia) can be selected from:
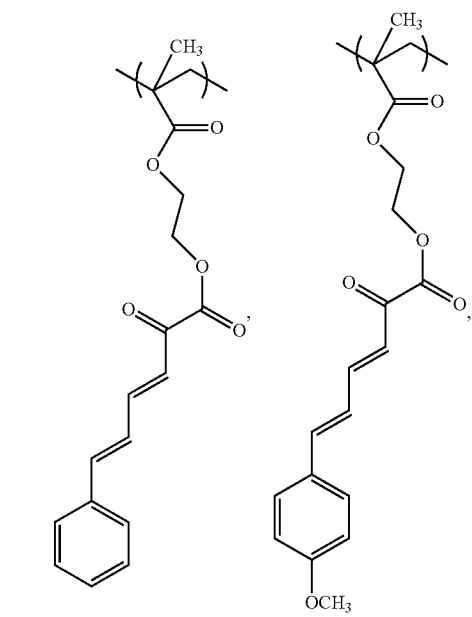

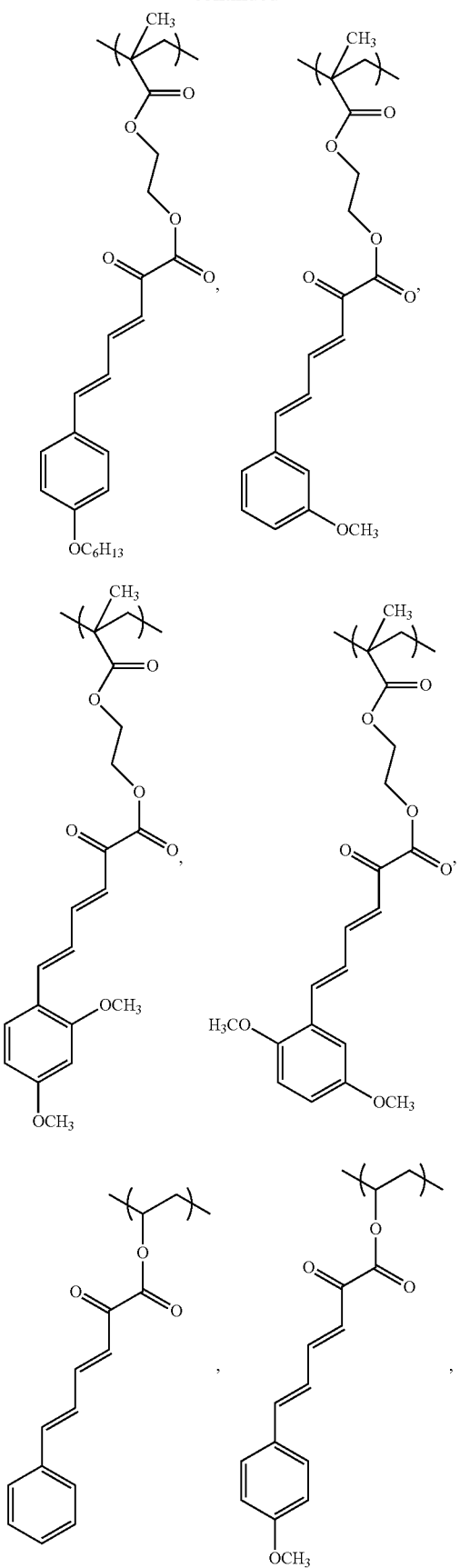
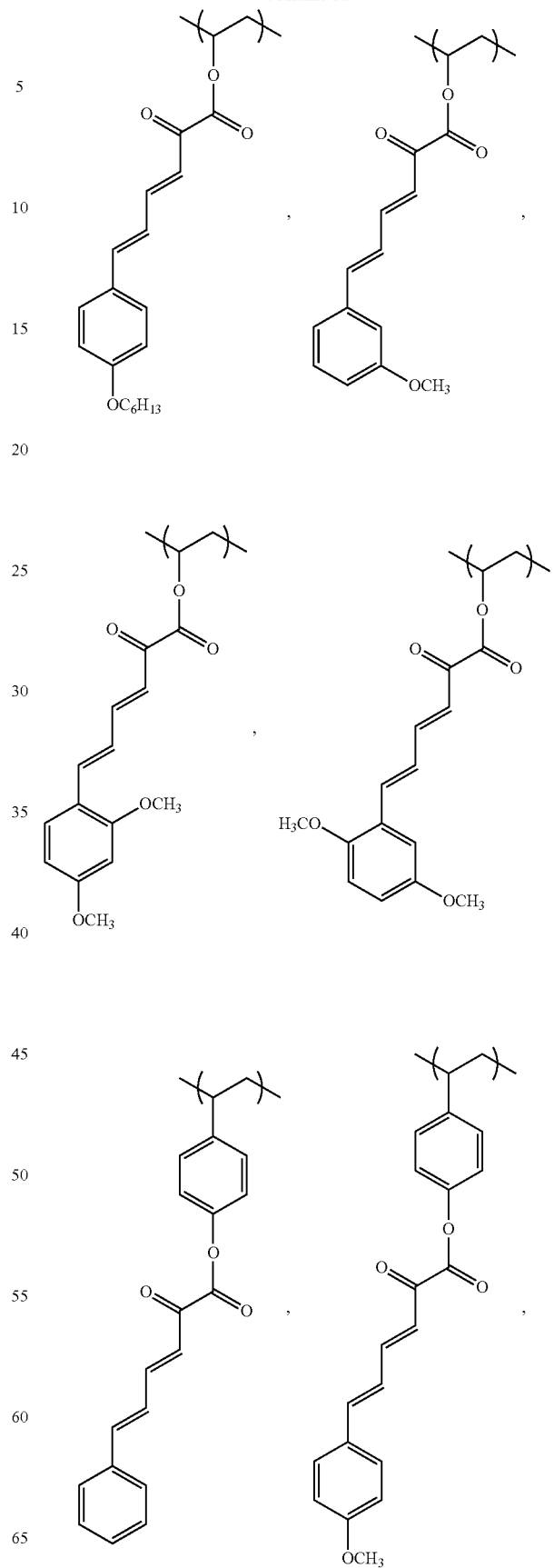

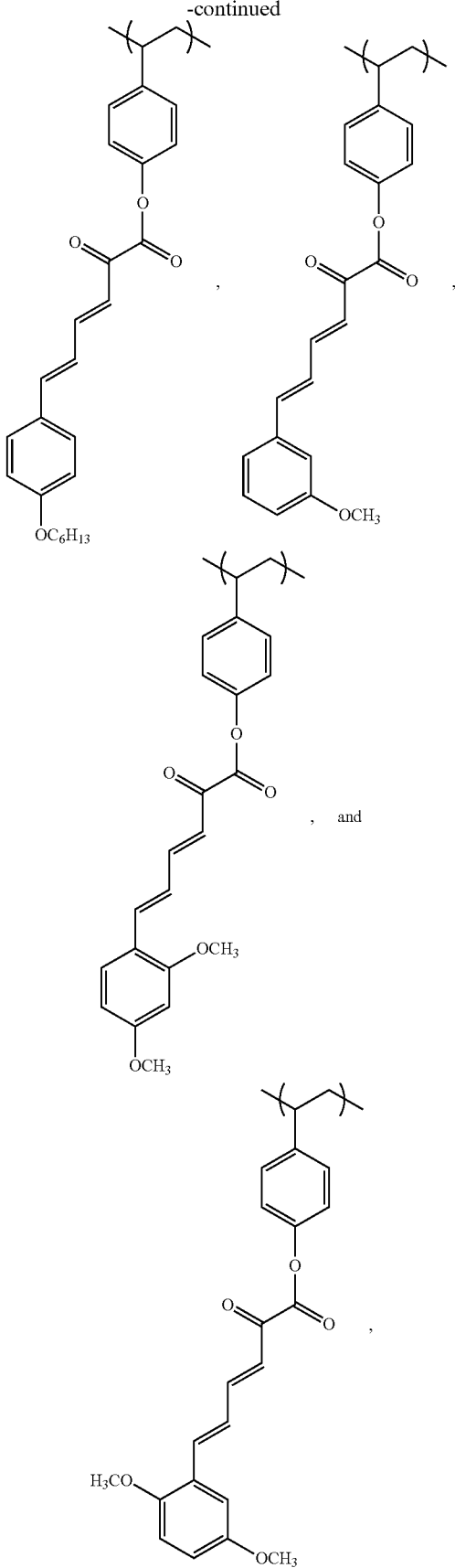
i.e., when q=1.
In certain embodiments, the present polymers can be homopolymers, specifically homopolymers of a repeating unit according to Formula (Ia). Accordingly, in particular embodiments, the present polymers can be a homopolymer of a repeating unit selected from:
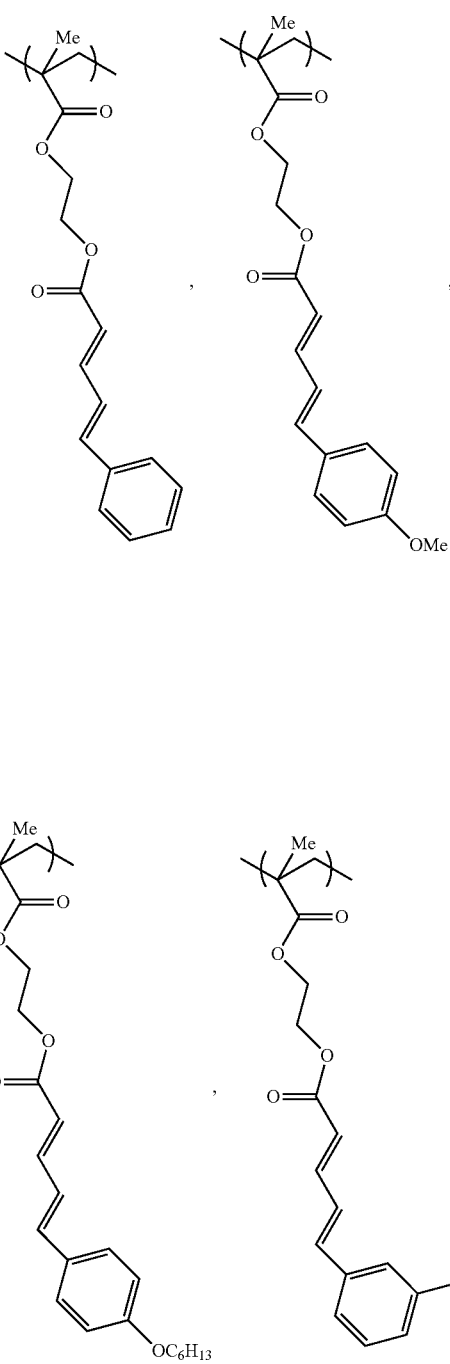

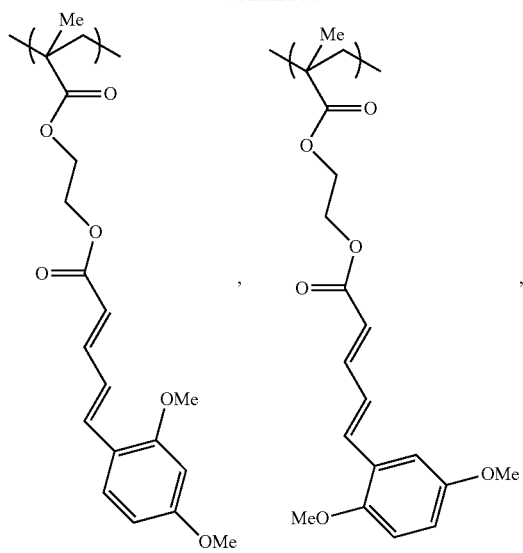
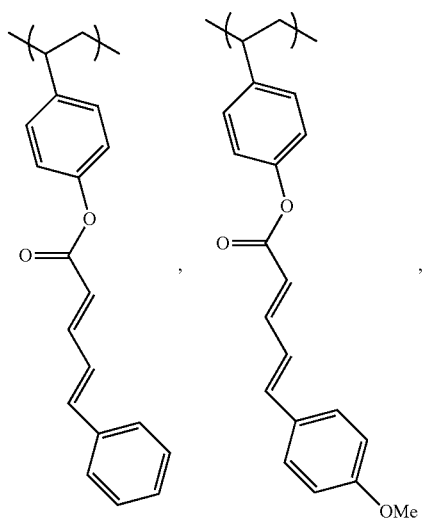
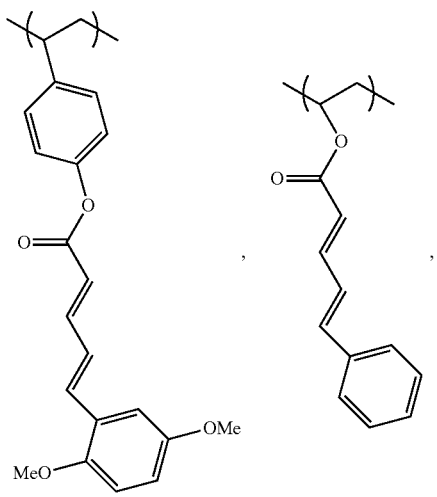
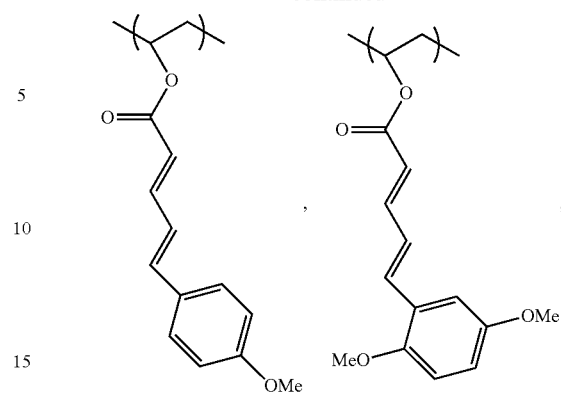
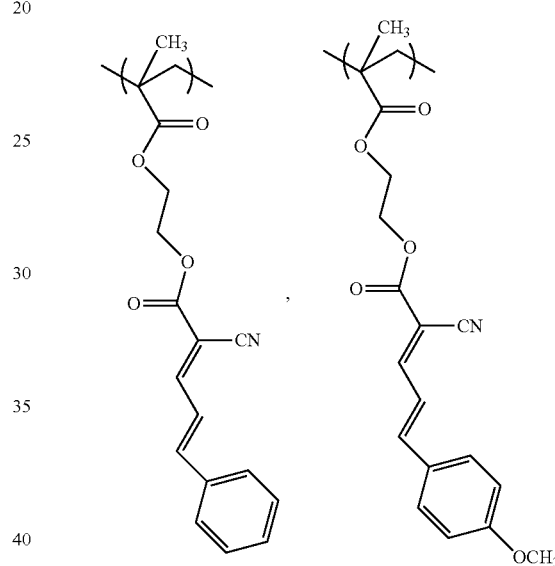
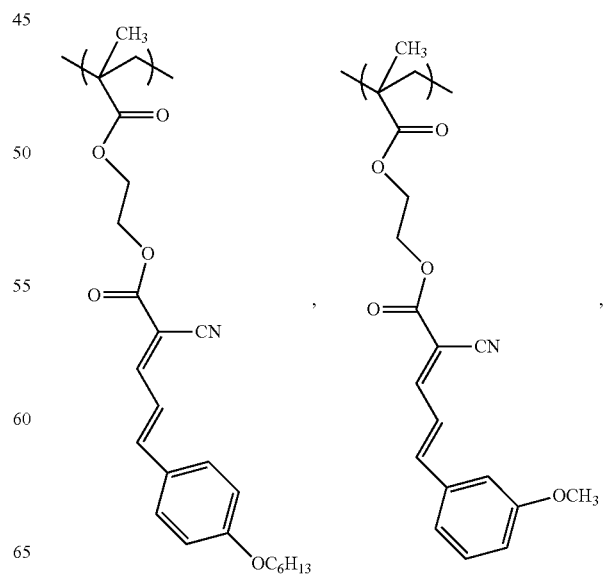

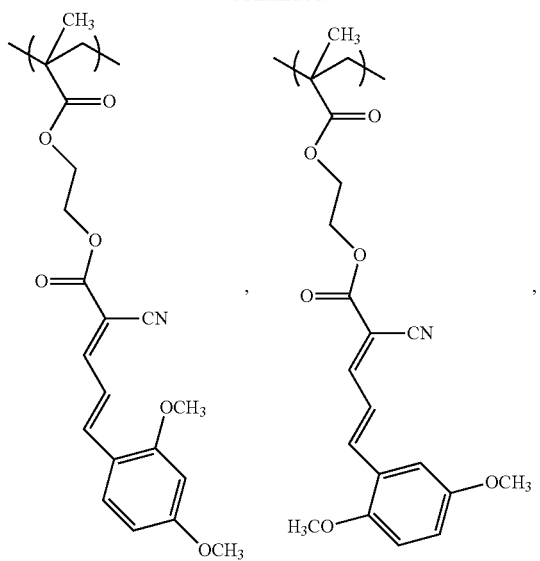
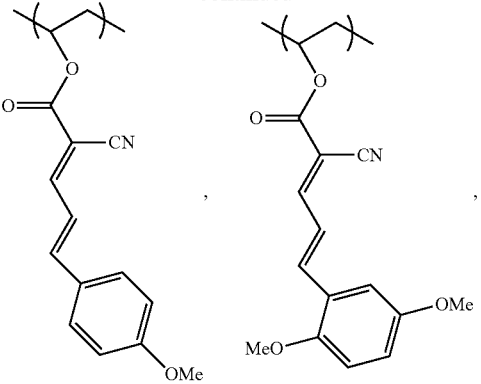
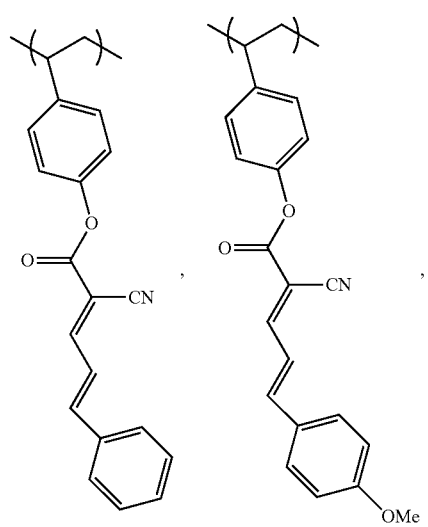
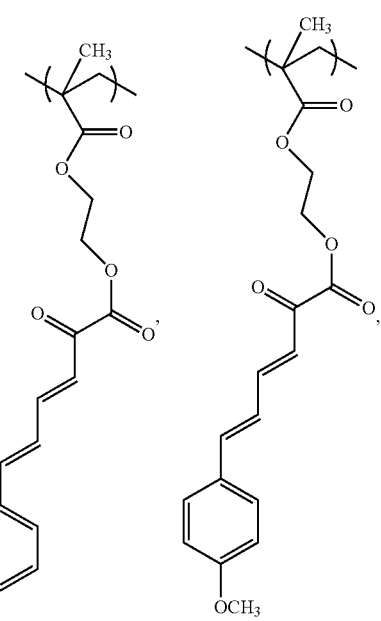
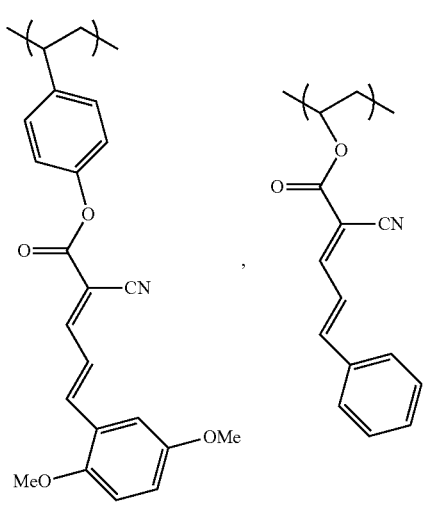
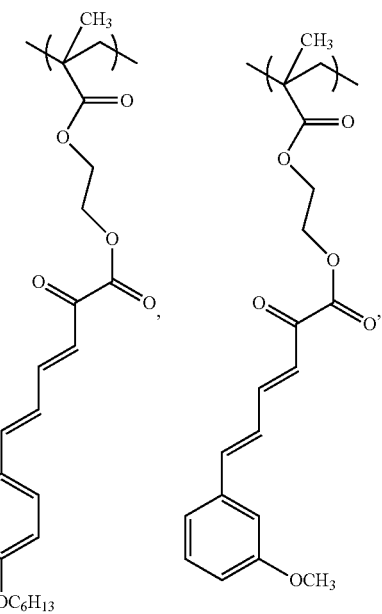

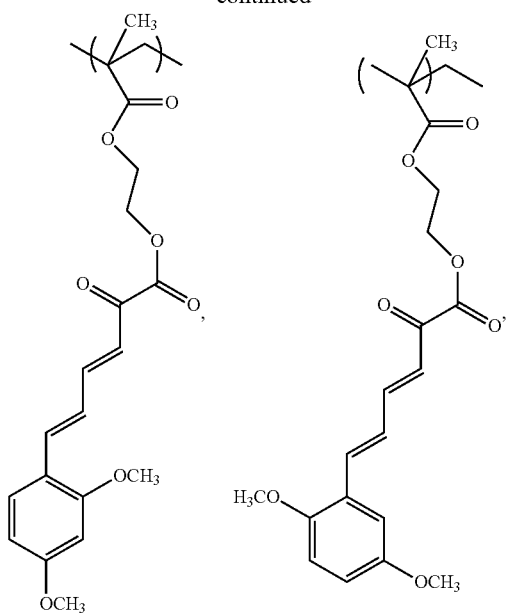
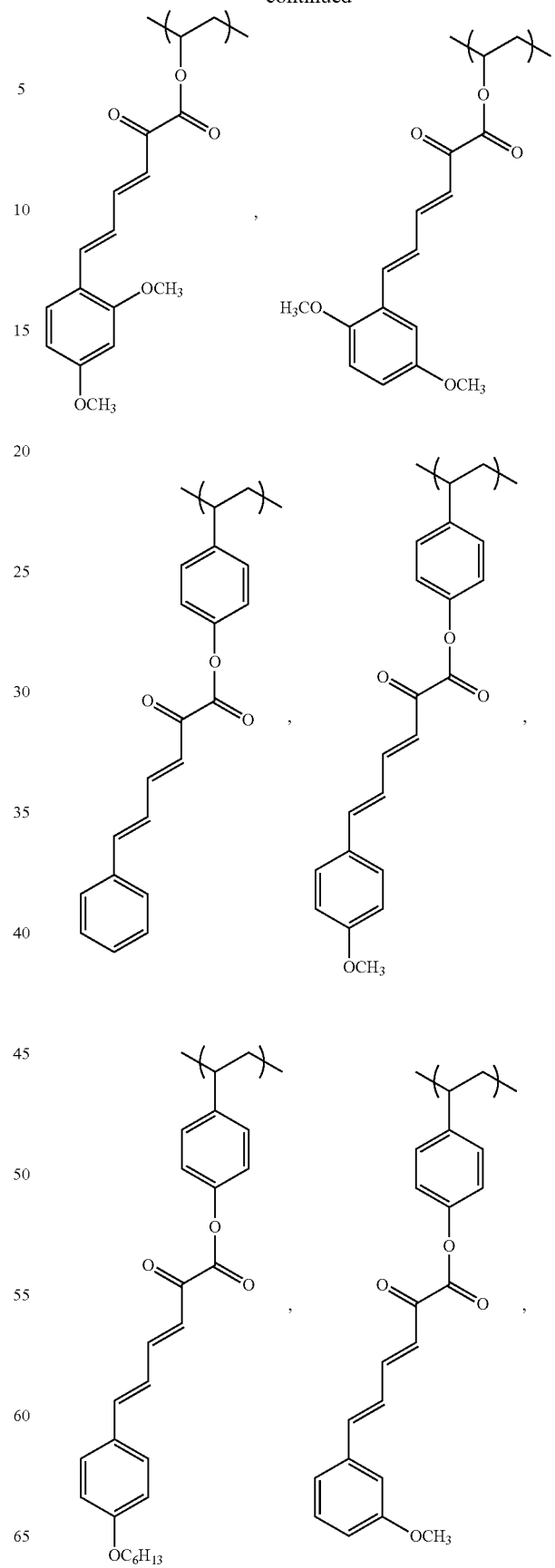

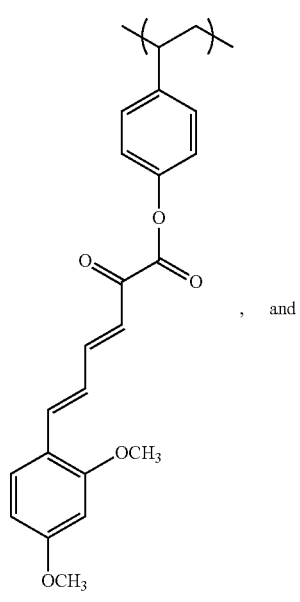

, and

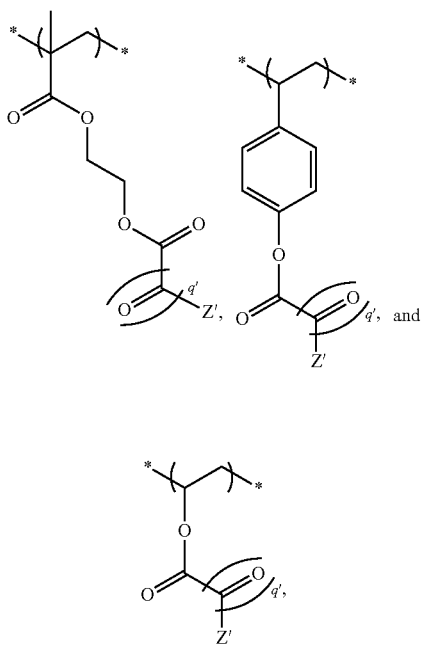

, and

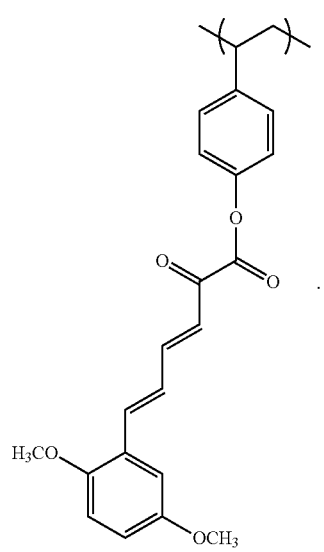

.

In other embodiments, the present polymers can be a copolymer including at least a first repeating unit of Formula (Ia) and a second repeating unit of Formula (Ib). In these embodiments, L' in the second repeating unit can be the same or different from L in the first repeating unit. Meanwhile, in certain embodiments, W can be Z' or $-(CR^{a'}=CR^{c'})-Z'$, where Z' can be selected from H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group. In other embodiments, W can be $-(CR^{a'}=CR^{c'})-(CR^{b'}=CR^{d'})-Z'$, provided that Z' is different from Z in the first repeating unit.

To illustrate, in certain embodiments, the second repeating unit of Formula (Ib) can be selected from:

wherein Z' can be a $C_{1-10}$ alkyl group or a $C_{1-10}$ haloalkyl group, and q is 0 or 1.

In certain embodiments, the second repeating unit of Formula (Ib) can be selected from:

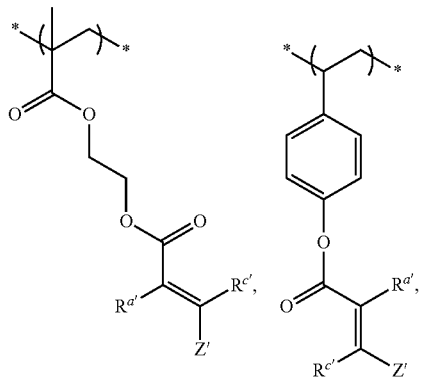

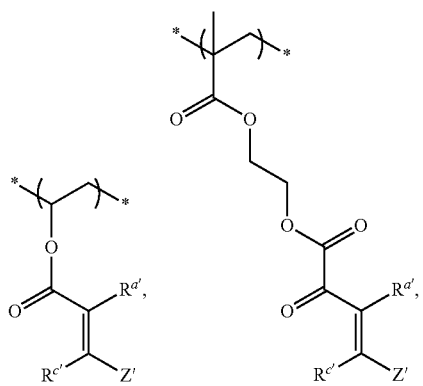

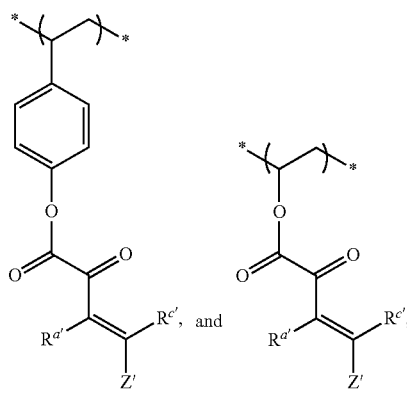

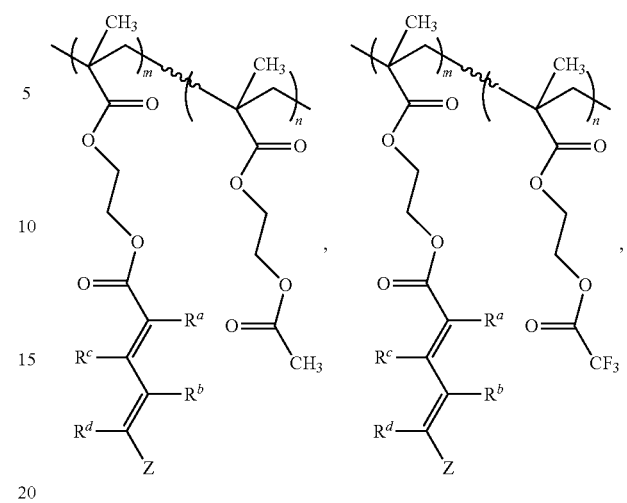

wherein $R^{a'}$ is selected from H, F, and $CH_3$; $R^{c'}$ is selected from H, $CH_3$, and a phenyl group; and Z' is selected from H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group. In particular embodiments, Z' can be an unsubstituted or substituted $C_{6-14}$ aryl or 5-14 membered heteroaryl group. For example, Z' can be a phenyl, naphthyl, or anthracenyl group optionally substituted with 1-5 groups independently selected from a halogen, CN, $R^e$, —O—$R^e$, —S—$R^e$, —C(O)—$R^e$, and —C(O)—O—$R^e$, wherein $R^e$, at each occurrence, is selected from a $C_{1-10}$ alkyl group, a $C_{1-10}$ haloalkyl group, a $C_{2-10}$ alkenyl group, and a $C_{2-10}$ alkynyl group. In other preferred embodiments, Z' can be an unsubstituted 5- or 6-membered heteroaryl group or a 5- or 6-membered heteroaryl group substituted with 1-5 groups independently selected from a halogen, CN, oxo, $R^e$, —O—$R^e$, —S—$R^e$, —C(O)—$R^e$, and —C(O)—O—$R^e$, wherein $R^e$, at each occurrence, is selected from a $C_{1-10}$ alkyl group, a $C_{1-10}$ haloalkyl group, a $C_{2-10}$ alkenyl group, and a $C_{2-10}$ alkynyl group. In yet other preferred embodiments, Z' can be an unsubstituted 5-6 bicyclic heteroaryl group or a 5-6 bicyclic heteroaryl group substituted with 1-5 groups independently selected from a halogen, CN, oxo, $R^e$, —O—$R^e$, —S—$R^e$, —C(O)—$R^e$, and —C(O)—O—$R^e$, wherein $R^e$, at each occurrence, is selected from a $C_{1-10}$ alkyl group, a $C_{1-10}$ haloalkyl group, a $C_{2-10}$ alkenyl group, and a $C_{2-10}$ alkynyl group. Examples of 5- or 6-membered heteroaryl groups and 5-6 bicyclic heteroaryl groups have been provided hereinabove.

In particular embodiments, L' in the second repeating unit can be the same as L in the first repeating unit. Accordingly, certain copolymers according to the present teachings can be represented by a formula selected from:

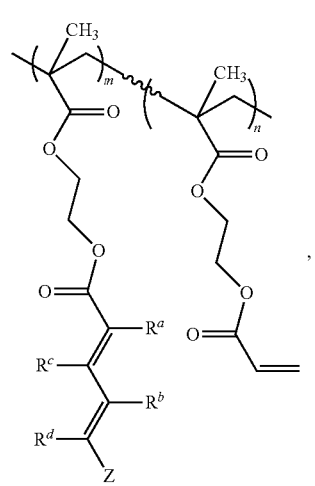

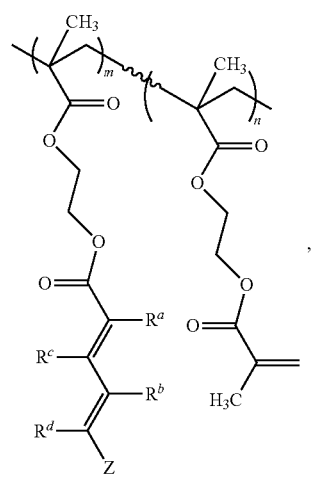

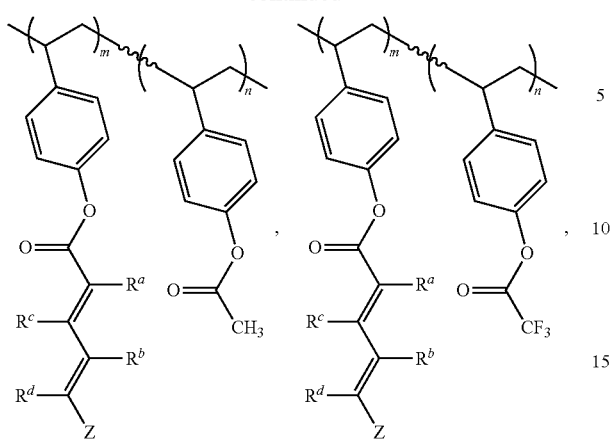,
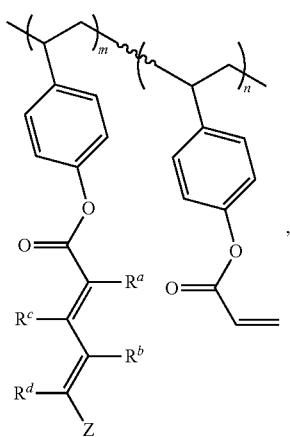,
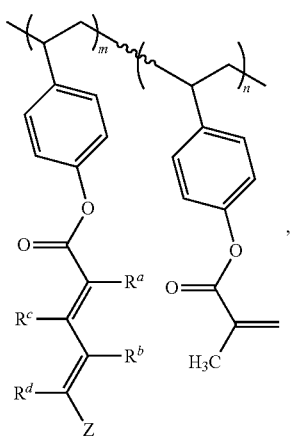,
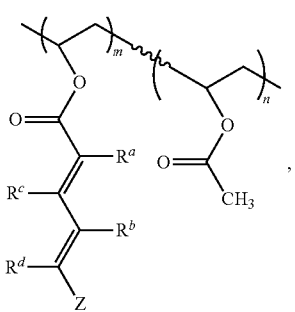,
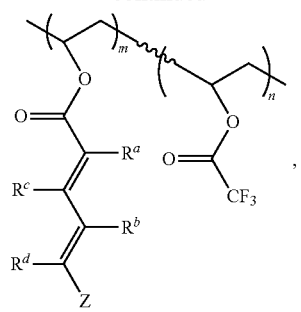,
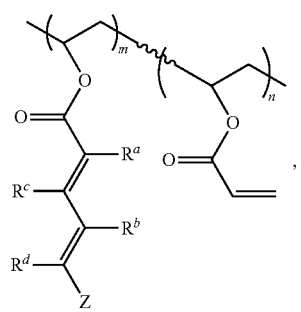,
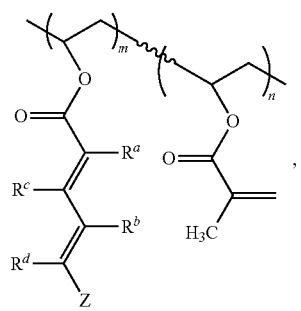,
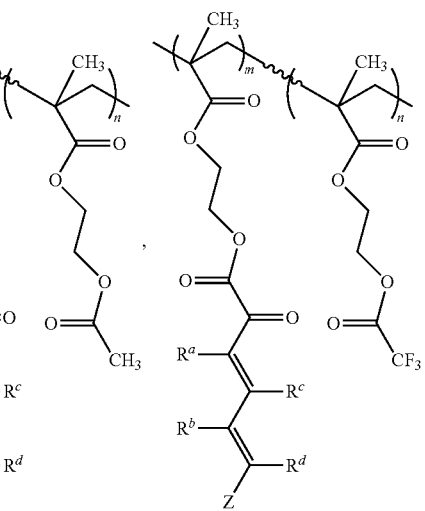,

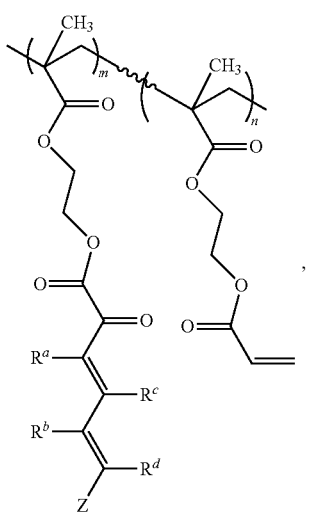
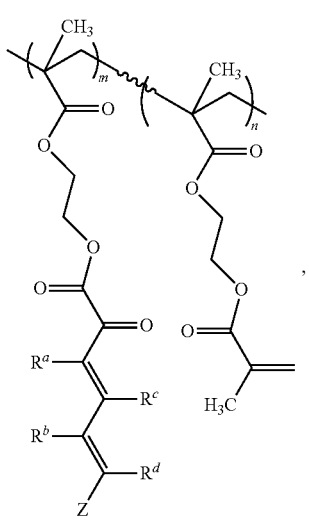
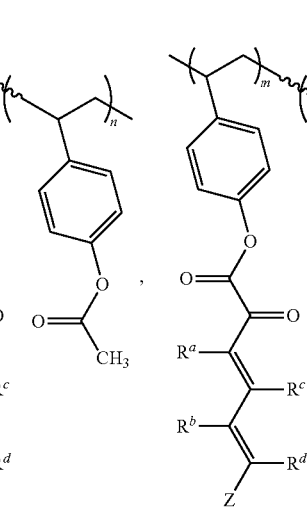
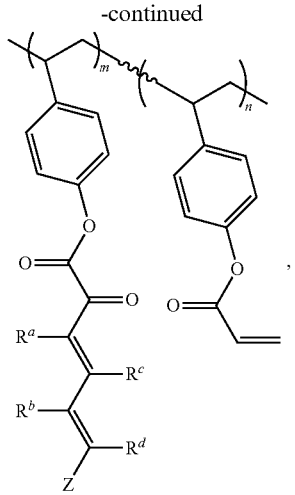
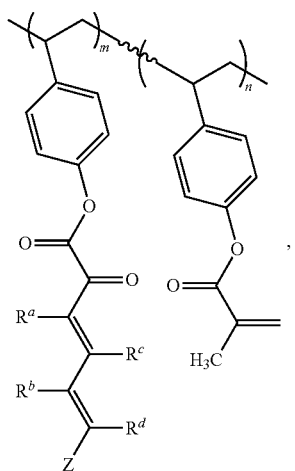
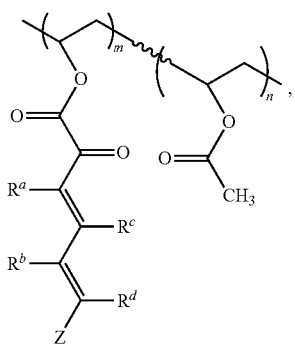
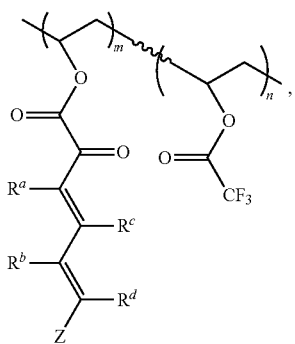

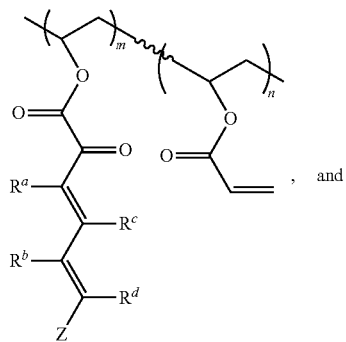

, and

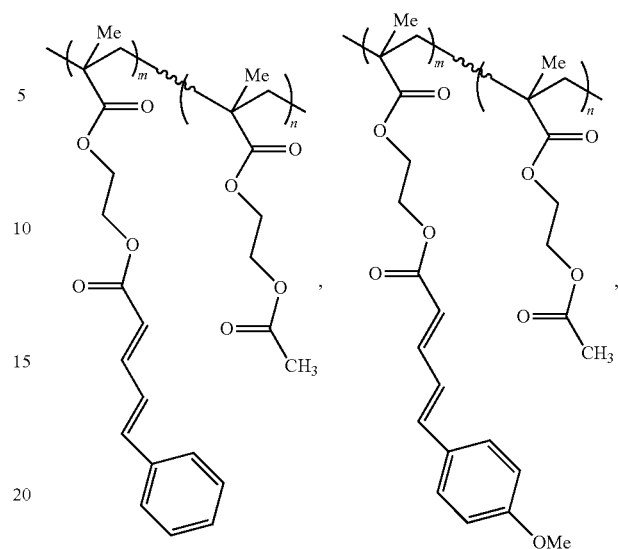

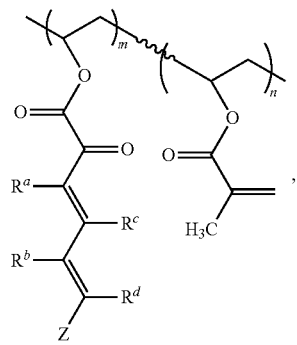

,

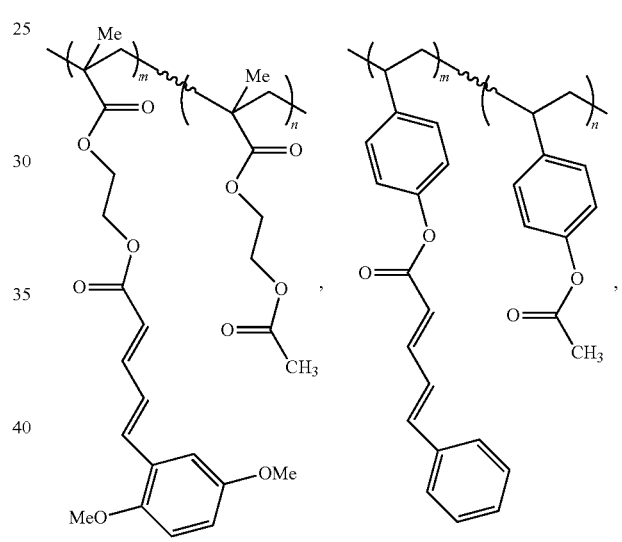

wherein m and n independently are a real number, provided that $0<m<1$, $0<n<1$, and $m+n=1$; and $R^a$, $R^b$, $R^c$, $R^d$, and Z are as defined herein. For example, $R^a$ and $R^b$ independently can be selected from H, F, and CN; $R^c$ and $R^d$ independently can be selected from H, $CH_3$, and a phenyl group; while Z can be a $C_{6-14}$ aryl or 5-14 membered heteroaryl group optionally substituted with 1-5 groups independently selected from a halogen, CN, $R^e$, —O—$R^e$, —S—$R^e$, —C(O)—$R^e$, and —C(O)—O—$R^e$, wherein $R^e$, at each occurrence, is selected from a $C_{1-10}$ alkyl group, a $C_{1-10}$ haloalkyl group, a $C_{2-10}$ alkenyl group, and a $C_{2-10}$ alkynyl group. For example, the ratio of m and n can be between about 0.01:0.99 and about 0.99:0.01. In preferred embodiments, m is between about 0.50 and about 0.99 and n is between about 0.01 and about 0.50. In more preferred embodiments, m is between about 0.70 and about 0.99 and n is between about 0.01 and about 0.30.

To further illustrate, specific examples of copolymers according to the present teachings can include:

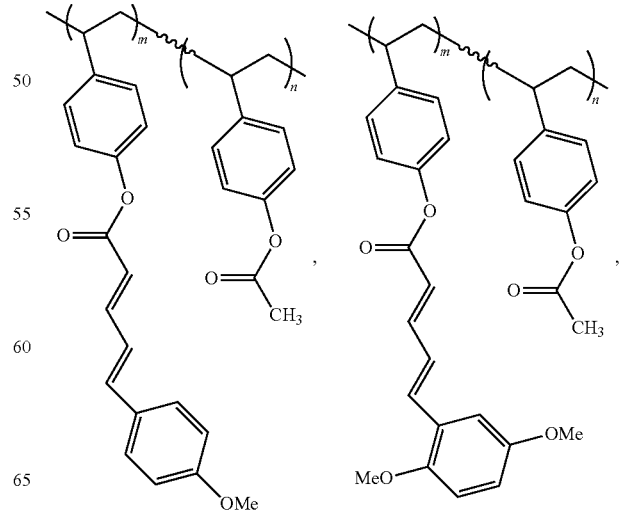

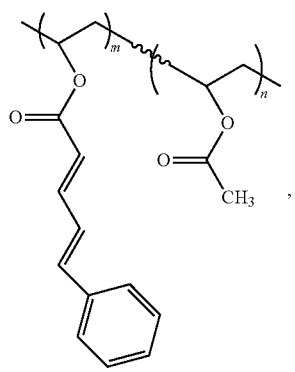

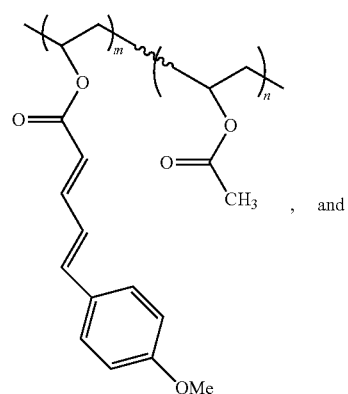, and

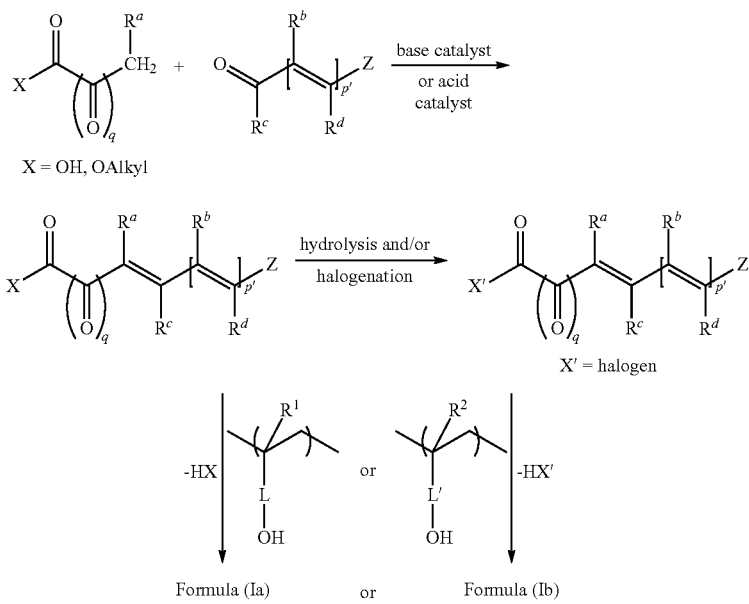

where m and n independently are a real number, wherein $0<m<1$, $0<n<1$, and $m+n=1$.

The present polymers can be derived from various polymers known in the art, specifically those having a hydroxyl group in the side chain which can be reacted with a (vinylene or) diene-containing carboxylic acid or derivative thereof to provide the first repeating unit of Formula (Ia), and optionally the second repeating unit of Formula (Ib). Examples of these polymers can include, without limitation, poly(2-hydroxyethyl methacrylate), poly(vinyl phenol), poly(vinyl alcohol), and copolymers thereof such as poly(vinyl alcohol-co-ethylene) and poly(vinyl phenol/methyl methacrylate). Exemplary synthetic routes are provided in the Examples hereinbelow.

For example, monomers and polymers of the present teachings generally can be synthesized according to Scheme 1. Thus, among other possible synthetic routes, one of the simplest methods to synthesize the monomers is by condensation of an acid/ester or alpha-keto acid/ester having an activated methylene group with an aldehyde (or an α,β-unsaturated aldehyde). After condensation, the monomer can be used without further modification, or the monomer can be converted into a more reactive species (such as by halogenation) before reaction with an hydroxyl-containing polymer backbone to produce the polymer of the present teachings.

For instance, the following monomers can be synthesized from procedures reported in the literature:

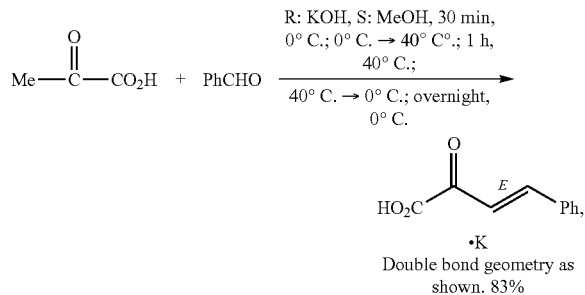

NOTE: stereoselective, Reactants: 2, Reagents: 1, Solvents: 1, Steps: 1, Stages: 1 see Belmessieri, D. et al., *JACS*, 133(8): 2714-2720 (2011);

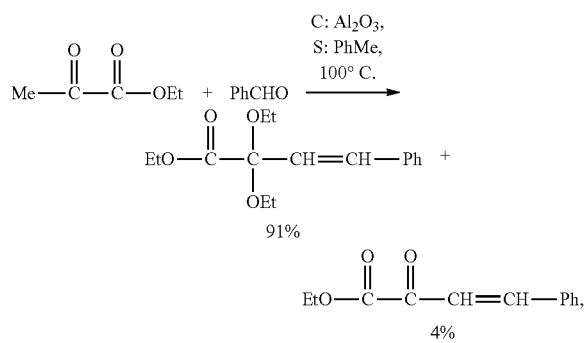

NOTE: Reactants: 2, Catalysts: 1, Solvents: 1, Steps: 1, Stages: 1 see Balodis, J.; *Materialzinatne un Lietiska Kimija*, 5: 42-46 (2002);

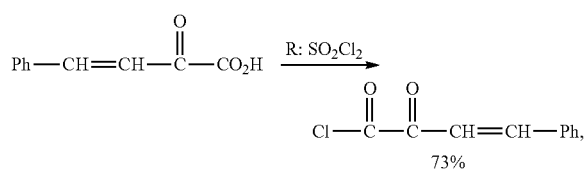

NOTE: Reactants: 1, Reagents: 1, Steps: 1, Stages: 1 see Ibrahim, Y. A.; *J. Het. Chem.*, 18(5): 953-956 (1981);

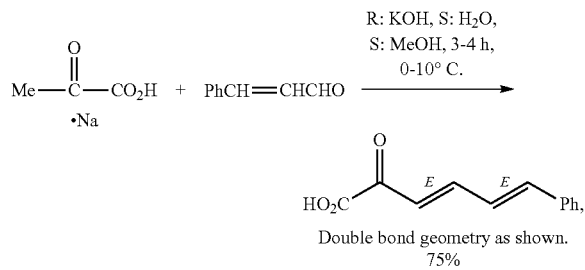

NOTE: Reactants: 2, Reagents: 1, Solvents: 2, Steps: 1, Stages: 1 see Thangavel, V., *Tetrahedron*, 63(19): 4126-4133 (2007); or

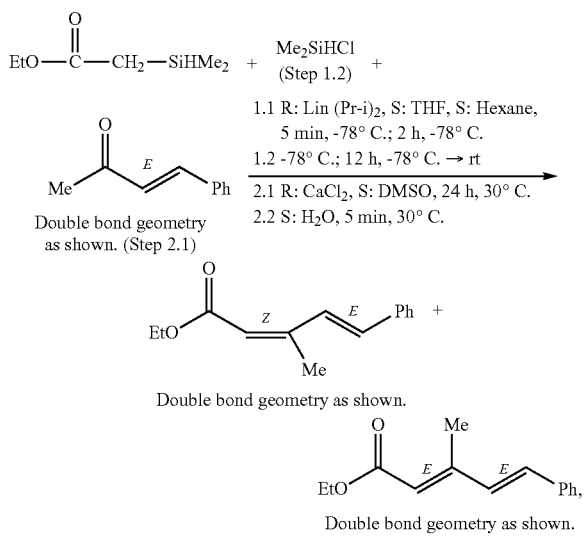

NOTE: 1) in-situ generated reagent, 2) stereoselective, Reactants: 3, Reagents: 2, Solvents: 4, Steps: 2, Stages: 4, Most stages in any one step: 2 see Miura, Katsukiyo; *Chem. Letts.*, 38(8): 832-833 (2009).

Prior to crosslinking, the polymers according to the present teachings generally are soluble in common organic solvents but can become significantly less soluble or insoluble in the same solvents after undergoing crosslinking. As used herein, a compound can be considered soluble in a solvent when at least 1 mg of the compound can be dissolved in 1 ml of the solvent. Compounds wherein less than 1 mg of the compound can be homogeneously dissolved in 1 ml of the solvent are considered insoluble.

More specifically, the present polymers can have satisfactory solubility in various common organic solvents, thereby affording formulations that are suitable for solution-phase processes. In certain embodiments, the present polymers can have satisfactory solubility in organic solvents that are orthogonal to those solvents (e.g., aromatic or polar chlorinated solvents) typically used to process common organic semiconducting molecules or polymers. This allows, for example, the fabrication of a solution-processed top-gate transistor, where the organic solvent used to dissolve the present polymers does not damage (i.e., dissolve, delaminate, swell, or otherwise physically disturb) or adversely affect the semiconducting properties of an underlying organic semiconductor material. Examples of organic solvents that can be used to formulate the present polymers include aliphatic hydrocarbons such as hexanes, cyclopentane, cyclohexane, n-nonane, n-decane, n-undecane, n-dodecane; alcohol solvents such as methanol, ethanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, methyl lactate, ethyl lactate and γ-butyrolactone; ether solvents such as diisopropyl ether, dibutyl ether, ethyl propyl ether, anisole, phenetole, and veratrole; and amide solvents such as N-methylpyrrolidinone and dimethylacetamide. These solvents can be used either singly or in combination, or as mixtures with water.

Accordingly, the present polymers can be mobilized in a liquid medium to provide a composition (a coating formulation) for forming a thin film material. The composition can be a solution, a dispersion, a suspension, an emulsion, or a gel, although in most embodiments, the composition used to provide the present polymer as a thin film is a solution or a dispersion suitable for solution-phase processes. The liquid medium can include solid and/or gaseous components, that is, the liquid medium can be in a vapor or gaseous form. As such, the term "liquid medium" can include a vaporized liquid medium. The term "mobilized in a liquid medium" broadly means that the designated liquid medium causes a designated solid to take on properties of a liquid or vapor. For example, the solid can be dissolved in the liquid medium to form a single-phase solution, or the solid can be dispersed in the liquid medium to form a two-phase dispersion. In other embodiments, the solid and the liquid medium can be combined together to form an emulsion, a suspension, a gel, or even micelles. As used herein, the term "solution" means that a substantial proportion of a designated solute has formed a single phase with a designated solvent, but a substantial solid, liquid and/or gaseous second phase that can include dispersed particulate matter also can be present.

In addition to the present polymers, the coating formulation can include other components that can be used to selectively modify certain properties such as the viscosity of the coating formulation, or the dielectric properties, thermal stability, and/or glass transition temperature of the film material to be formed. The coating formulation also can include initiators and/or sensitizers such as those described hereinabove to modify the crosslinkability of the present polymers. Accordingly, in some embodiments, the coating formulation can include one or more additives independently selected from viscosity modulators, detergents, dispersants, binding agents, compatibilizing agents, curing agents, initiators, sensitizers, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the coating formulation can include another linear dielectric polymer, a metal oxide, a silane crosslinker, an acrylate crosslinker, and/or combinations thereof, which can be used to prepare a blend dielectric material. For example, metal oxide fillers can be used to provide a higher dielectric constant. Fillers having a high dielectric constant include metal oxides such as $SiO_2$, $Al_2O_3$, $TiO_2$, and the like; nitrides such as $Si_3N_4$; and paraelectric ceramic fillers such as barium titanate, strontium titanate, and lead zirconate.

As used herein, "solution-processable" or "solution-processed" refers to the ability of a compound, for example, the present polymers, to be processed via various solution-phase processes. A coating formulation comprising the present polymers can be deposited on a substrate, such as an electrically conductive material (e.g., source, drain, or gate electrodes in a transistor) or a semiconductor material (e.g., the charge-carrying layer in a transistor), via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For non-contact printing techniques such as inkjet printing, the solubility requirement generally can be less stringent and a solubility range as low as about 1-4 mg/ml can suffice. For gravure printing, a higher solubility range may be necessary, often in the range of about 50-100 mg/ml. Other contact printing techniques such as screen-printing and flexo printing can require even higher solubility ranges, for example, about 100-1000 mg/ml The resulting film can take various forms including a wafer, a layer, a sheet, or an elongated web. Thin film materials based upon a polymer according to the present teachings can be monolithic (composed of a single homogenous layer) or can have multiple sublayers, where the multiple sublayers can have identical (homogeneous) or different (heterogeneous) chemical compositions.

One of the advantages of the polymers disclosed herein is their ability to crosslink, for example, photocrosslink, after deposition onto a substrate. The crosslinking functionality allows formation of a densely crosslinked polymeric matrix. The crosslinked polymeric matrix is robust enough to withstand various conditions that are common in device fabrication processes, including patterning and subsequent solution-phase processes, for example, to form/deposit overlying layers (e.g., the semiconductor layer in a bottom-gate TFT). Without wishing to be bound to any particular theory, the crosslinking chemistry can include a 2+2 photo-stimulated cycloaddition that provides stable cyclobutane moieties. The crosslinking chemistry can also involve free radical additions.

Polymers of the present teachings can be photocrosslinked by light exposure, for example, at a wavelength of about 250 nm to about 500 nm. Photocrosslinking can be carried out by flood exposure (i.e., without filter) or by exposure to irradiation at selective wavelengths, for example, in the H (404.7 nm), G (435.8 nm) or I (365.4 nm) line of the spectrum. One of the advantages of the present polymers can be the possible use of longer wavelengths (e.g., >350 nm) for photocuring. In particular, as described in Example 3 hereinbelow, embodiments which include an additional carbonyl group (i.e., when q=1) and/or cyano group (e.g., $R^a$=CN) can exhibit a red-shift in the wavelengths necessary for photocrosslinking, hence eliminating the need to use photosensitizers, which typically have a detrimental effect on leakage properties. Accordingly, an advantage of preparing a dielectric material using the present polymers can be that the formulations (which include the present polymers) from which the dielectric material is prepared can be free of ionic photo-initiators (which are known to compromise the dielectric strength of a material i.e., leading to high leakage), particularly, free of acid photo-initiators which can generate acidic moieties that will act as charge traps. For example, formulations for preparing dielectric materials according to the present teachings can be free of various photoinitiators commonly found in existing photocurable compositions (e.g., existing photo-crosslinkable dielectric materials or photoresist materials) including ionic photoacid generators such as:

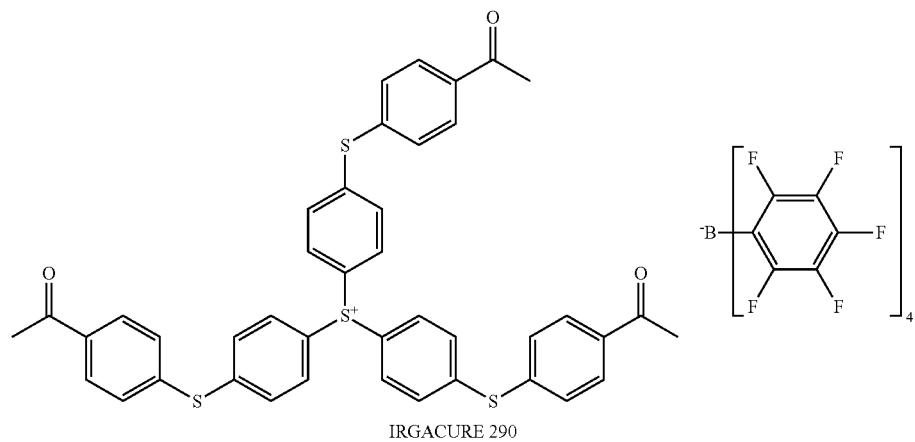

IRGACURE 290

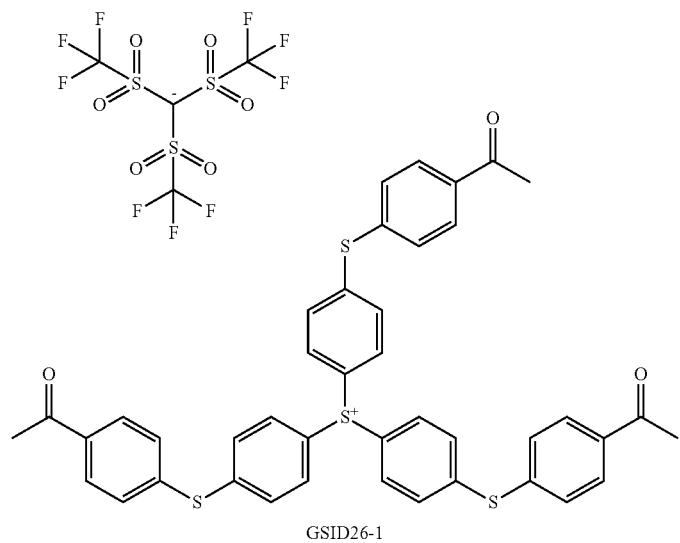

GSID26-1 and non-ionic photoacid generators such as:

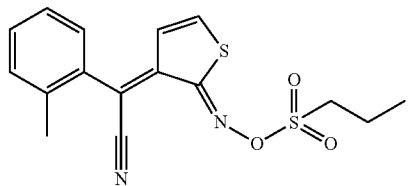

IRGACURE 103

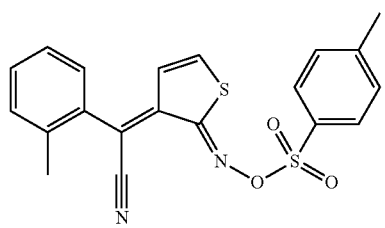

IRGACURE 121

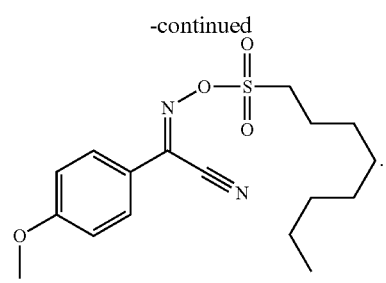

CGI-725

In addition to light exposure, crosslinking of the present polymers also can be achieved by other types of radiation, for example, with ion beams of charged particles, and with radioactive sources. Subsequent to the formation of the crosslinked matrix, the thin film material of the present teachings can be subjected to further patterning and process steps, by which additional layers, including additional dielectric, semiconductor and/or conducting layers, can be formed thereon.

As demonstrated by the Examples hereinbelow, the present polymers also can be cured at lower curing dose and/or in shorter curing times compared to known photocurable dielectric materials. The fact that the present polymers can be cured at lower curing dose and/or in shorter curing times would minimize damage to adjacent layers (e.g., an underlying organic semiconductor layer) during device fabrication. This also leads to the possibility of using the present polymers as photoresist materials, for example, as a negative photoresist material for patterning a semiconductor layer. Specifically, the present polymers can be exposed to radiation through a photomask, then developed using appropriate developers, thereby protecting the semiconductor layer underneath from reactive ion plasma etching.

The present polymers typically have excellent electrically insulating properties and a low leakage current density, which enable their use as dielectrics. Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate dielectric in a thin-film transistor device. As known by those skilled in the art, the leakage current density of a dielectric material can be determined by fabricating a standard metal-insulator-semiconductor (MIS) and/or metal-insulator-metal (MIM) capacitor structures with the dielectric material, then measuring the leakage current, and dividing the measured current by the area of the metal electrodes.

In various embodiments, the present polymers can have very low leakage current densities as measured from standard MIS and MIM capacitor structures. For example, dielectric materials prepared from a polymer according to the present teachings can have a leakage current density of less than or equal to about $1 \times 10^{-6}$ A/cm$^2$ at E=2 MV/cm, less than or equal to about $1 \times 10^{-7}$ A/cm$^2$ at E=2 MV/cm, less than or equal to about $1 \times 10^{-8}$ A/cm$^2$ at E=2 MV/cm, less than or equal to about $8 \times 10^{-9}$ A/cm$^2$ at E=2 MV/cm, less than or equal to about $7 \times 10^{-9}$ A/cm$^2$ at E=2 MV/cm, less than or equal to about $6 \times 10^{-9}$ A/cm$^2$ at E=2 MV/cm, less than or equal to about $4 \times 10^{-9}$ A/cm$^2$ at E=2 MV/cm, less than or equal to about $2 \times 10^{-9}$ A/cm$^2$ at E=2 MV/cm, or less than or equal to about $1 \times 10^{-9}$ A/cm$^2$ at E=2 MV/cm. Dielectric materials prepared from the present polymers also can withstand very high breakdown voltages (i.e., the maximum voltage difference that can be applied across the dielectric before it breaks down and begins to conduct). For example, dielectric materials of the present teachings can withstand a breakdown voltage of 4 MV/cm or higher, a breakdown voltage of 6 MV/cm or higher, or a breakdown voltage of 7 MV/cm or higher.

The present polymers also can have improved air and moisture stability compared to existing known photocurable dielectric materials such that devices incorporating the present polymers can exhibit minimal gate bias stress hysteresis. While many photocurable polymers have been investigated as possible dielectric materials, despite reasonable low leakage properties, many of these polymers introduce significant bias-stress induced instability to device performance.

As described hereinabove, because the present polymers can be soluble in solvents that are orthogonal to those commonly used to dissolve organic or inorganic semiconducting compounds, the present polymers can be used, in whole or in part, as the dielectric layer of a solution-processed organic field-effect transistor. A typical field-effect transistor (FET) includes a number of layers and can be configured in various ways. For example, a FET can include a substrate, a dielectric layer, a semiconductor layer, source and drain electrodes in contact with the semiconductor layer, and a gate electrode adjacent to the dielectric layer. When a potential is applied on the gate electrode, charge carriers are accumulated in the semiconductor layer at an interface with the dielectric layer. As a result, a conductive channel is formed between the source electrode and the drain electrode and a current will flow if a potential is applied to the drain electrode.

FIG. 1 illustrates the four common types of FET structures: (a) bottom-gate top-contact structure, (b) bottom-gate bottom-contact structure, (c) top-gate bottom-contact structure, and (d) top-gate top-contact structure. As shown in FIG. 1, a FET can include a dielectric layer (e.g., shown as 8, 8', 8", and 8''' in FIGS. 1a, 1b, 1c, and 1d, respectively), a semiconductor/channel layer (e.g., shown as 6, 6', 6", and 6''' in FIGS. 1a, 1b, 1c, and 1d, respectively), a gate contact (e.g., shown as 10, 10', 10", and 10''' in FIGS. 1a, 1b, 1c, and 1d, respectively), a substrate (e.g., shown as 12, 12', 12", and 12''' in FIGS. 1a, 1b, 1c, and 1d, respectively), and source and drain contacts (e.g., shown as 2, 2', 2", 2''', 4, 4', 4", and 4''' in FIGS. 1a, 1b, 1c, and 1d, respectively). One or more optional layers also can be present. For example, an optional buffer layer can be deposited on top of the substrate to improve the wetting and crystallization of an overlying layer. An optional surface-modifying film can be disposed on the gate electrode.

Figure 2:
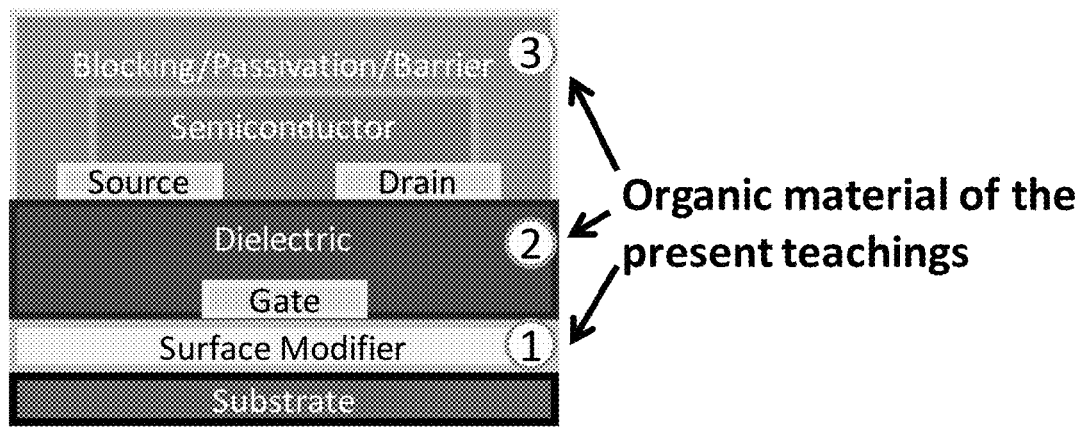
FIG. 2 shows a bottom-gate top-contact thin film transistor, illustrating that the polymers of the present teachings can be employed as a surface modifying layer (layer 1), a gate dielectric layer (layer 2), and/or an etch-stop/blocking/passivation/barrier/encapsulation layer (layer 3).

Using an example of a bottom-gate top-contact thin film transistor, FIG. 2 illustrates where the organic material of the present teaching can be employed: in layer 1 (as a surface modifier), layer 2 (as the gate dielectric), and/or encapsulation layer 3 (as an etch-stop/blocking/passivation/barrier material).

Accordingly, the present polymers can be deposited as a thin film material adjacent to a semiconductor layer and function as the dielectric layer in a thin film transistor. Specifically, the thin film material can be coupled to the semiconductor thin film layer on one side and an electrically conductive component (i.e., a gate electrode) on the opposite side. The thickness of the dielectric layer typically ranges from about 10 nm to about 5000 nm, preferably from about 50 nm to about 1000 nm, and more preferably from about 200 nm to about 500 nm. In some embodiments, one or more interlayers can be present between the semiconductor layer and the dielectric layer comprising the present polymers. The interlayer(s) can be prepared from one or more linear dielectric polymers, examples of which are provided hereinbelow.

In some embodiments, the dielectric layer can be a multilayer laminate having two or more layers of dielectric materials sequentially deposited on top of each other (although one or more interlayers can be present), where at least one of the layers is prepared from a composition including a polymer according to the present teachings. For example, the multi-layer laminate can include at least one layer prepared from a composition including the present polymers alone in a liquid medium, and at least one layer prepared from a linear dielectric polymer or an inorganic (e.g., metal oxide) dielectric material. In embodiments where the dielectric material includes organic and inorganic sublayers, an interlayer can be present to improve adhesion between the sublayers.

Examples of linear dielectric polymers that can be used in combination with the present polymers (either in the same dielectric layer or in a separate dielectric layer) can include, without limitations, fluorinated para-xylene, fluoropolyarylether, fluorinated polyimide, polystyrene, poly(α-methyl styrene), poly(α-vinylnaphthalene), poly(vinyltoluene), polyethylene, cis-polybutadiene, polypropylene, polyisoprene, poly(4-methyl-1-pentene), poly(tetrafluoroethylene), poly(chlorotrifluoroethylene), poly(2-methyl-1,3-butadiene), poly(p-xylylene), poly(α-α-α'-α'-tetrafluoro-p-xylylene), poly[1,1-(2-methyl propane) bis(4-phenyl)carbonate], poly(cyclohexyl methacrylate), poly(4-chlorostyrene), poly(2,6-dichlorostyrene), poly(4-bromostyrene), poly(2,6-dimethyl-1,4-phenylene ether), polyisobutylene, poly(vinyl cyclohexane), poly(arylene ether), polyphenylene, poly(ethylene/tetrafluoroethyelene), poly(ethylene/chlorotrifluoroethylene), fluorinated ethylene/propylene copolymer, polystyrene-co-α-methyl styrene, ethylene/ethyl acetate copolymer, poly(styrene/butadiene), poly(styrene/2,4-dimethylstyrene), polypropylene-co-1-butene, poly(methyl methacrylate), poly(ethyl methacrylate), poly(2-hydroxyethyl methacrylate), poly(butyl methacrylate), poly(hexyl methacrylate), poly(benzyl methacrylate), poly(vinyl phenol), poly(vinyl alcohol), poly(vinyl alcohol-co-ethylene), poly(isobutylene/methyl methacrylate), poly(vinyl phenol/methyl methacrylate), poly(vinyl chloride), polysaccharides such as 2-hydroxyethyl cellulose, cellulose actate, cellullose acetate butyrate, ethyl cellulose; cyanated (ethoxylated) polysaccharides such as cyanopullulan (e.g., CYMM®), benzocyclobutene-based polymers, poly(2-vinylpyridine), poly(4-vinylpyridine), poly(4-vinylpyridine-co-butyl methacrylate), poly(4-vinylpyridine-co-styrene), poly(1-vinylpyrrolidone-co-styrene), poly(1-vinylpyrrolidone-co-vinyl acetate), poly(vinylidine fluoride), polyacrylonitrile, poly(acrylonitrile-co-butadiene-co-styrene), poly(acrylonitrile-co-methyl acrylate), polyacrylamide, poly(N-isopropylacrylamide), poly(2-ethyl-2-oxazoline), polyvinylpyrrolidone, poly(pentafluorostyrene), poly(dimethylsiloxane), poly(tetrahydrofuran), poly(methyl vinyl ether), poly(methyl vinyl ether-alt-maleic anhydride), poly(ethyl vinyl ether), poly(ethylene-alt-maleic anhydride), poly(allylamine), poly(ethyleneimine), poly(vinyl acetate), poly(vinyl cinnamate), poly(vinyl stearate), poly(vinyl propionate), poly(vinyl formate), poly(ethylene glycol), poly(propylene glycol), poly(styrene-co-acrylonitrile), poly(maleic anhydride-alt-1-octadecane), poly(tetrahydrofuryl methacrylate), poly(Bisphenol A carbonate), poly(propylene carbonate), poly(1,4-butylene terephthalate), poly(diallyl isophthalate), poly(hexafluoropropylene oxide), poly(fluoropropylene oxide-co-perfluoroformaldehyde), and combinations thereof. In addition, perfluoro(1-butenyl vinyl ether) homocyclopolymers (for example, those under the trade name CYTOP®) can be used. Examples of such fluorinated cyclopolymers include those having one of the following structures:

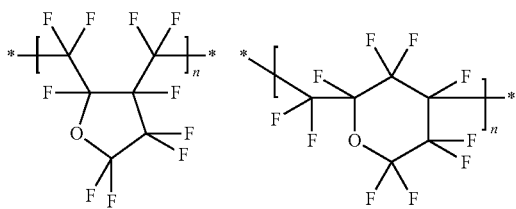

Poly[4,5-difluoro-2,2-bis(trifluoromethyl)-1,3-dioxole-co-tetrafluoroethylene (commercially available under the trade name Teflon® AF 2400) having the following structure also can be used:

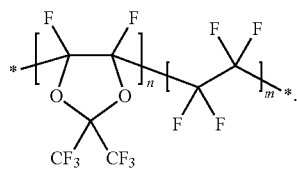

The semiconductor layer can comprise an organic semiconductor material prepared from an organic semiconducting molecule or polymer. Examples include various fused heterocycles, aromatic hydrocarbons (e.g., pentacene), polythiophenes, fused (hetero)aromatics (e.g., perylene imide and naphthalene imide small molecule or polymers), and other such organic semiconductor compounds or materials, whether p-type or n-type, otherwise known or found useful in the art. For example, the semiconductor component can be prepared from one or more compounds and/or polymers as described in U.S. Pat. Nos. 6,585,914, 6,608,323, 6,991,749, 7,374702, 7,528,176, 7,569,693, 7,605,225, 7,671,202, 7,893,265, 7,892,454, 7,902363, 7,928,249, 7,947,837, 8,022,214; and International Publication Nos. WO2009/098254, WO2009/098252, WO2009/098253, WO2009/098250, WO2010/117449, and WO2011/082234. In some embodiments, the semiconductor layer can comprise an inorganic semiconductor material such as silicon, germanium, gallium arsenide, various metal oxides and metal chalcogenides known in the art, and the like. Examples of metal oxide semiconductors include indium oxide ($In_2O_3$), indium zinc oxide (IZO), zinc tin oxide (ZTO), indium gallium oxide (IGO), indium-gallium-zinc oxide (IGZO), indium tin zinc oxide (ITZO), tin oxide ($SnO_2$), and zinc oxide (ZnO). Examples of metal chalcogenide semiconductors include cadmium sulfide (CdS), cadmium selenide (CdSe), and the like. Solution-phase processed metal oxides and metal chalcogenides are described in, for example, U.S. Pat. No. 8,017,458. Alternatively, the semiconductor layer can comprise a vapor-phase processed (e.g., sputtered) metal oxide or chalcogenide.

A dielectric material according to the present teachings can be prepared by dissolving one or more polymers described herein in an organic solvent to provide a dielectric composition, depositing (e.g., by spin-coating or printing) the dielectric composition onto a substrate, and optionally performing at least one curing step to form a dielectric material. For example, the curing step can involve irradiation (e.g., by flood exposure to light or by exposure to selective wavelengths within the UV-vis spectrum). In certain embodiments, one or more metal oxides can be added to the dielectric composition prior to the depositing step. In certain materials, one or more linear dielectric polymers can be added to the dielectric composition prior to the depositing step. In certain embodiments, a post-irradiation baking step can be performed. An organic semiconductor layer can be formed via a solution-phase process prior or after the formation of the dielectric layer. For example, the organic semiconductor layer can be formed from a composition comprising an organic semiconducting molecule or polymer in an organic solvent that is orthogonal to the organic solvent in the dielectric composition. An inorganic semiconductor can be formed by vapor deposition such as sputtering.

In some embodiments, a multi-layer dielectric material according to the present teachings can be prepared by dissolving one or more polymers described herein in an organic solvent to provide a dielectric composition, where the dielectric composition optionally can include at least one of a linear dielectric polymer, a metal oxide, and a crosslinker; depositing (e.g., by spin-coating or printing) the dielectric composition onto a substrate to form a first layer; and depositing a composition that includes a linear dielectric polymer or a metal oxide to form a second layer. After each depositing step, a curing step can be performed, e.g., by irradiation and optionally heating using parameters described herein. An organic semiconductor layer can be formed via a solution-phase process prior or after the formation of the multi-layer dielectric layer. For example, the organic semiconductor layer can be formed from a composition comprising an organic semiconducting molecule or polymer in an organic solvent that is orthogonal to the organic solvent in the dielectric composition. An inorganic semiconductor can be formed by vapor deposition such as sputtering.

Crosslinked thin film materials prepared from the present polymers also can be used as a passivation layer in a thin film transistor given their barrier properties to moisture and oxygen. When used as a passivation layer, the thin film material can have a thickness in the range of about 0.2 µm to about 5 µm. The passivation layer can be prepared by dissolving one or more polymers described herein in an organic solvent to provide a coating formulation, depositing (e.g., by spin-coating or printing) the coating formulation onto a substrate (e.g., overlying the source and drain electrodes), and optionally performing at least one curing step to form a passivation layer. The curing step can be by radiation and also optionally by heat. By using the present crosslinked organic materials, which can provide improved moisture- and oxygen-blocking properties, as the passivation layer, the thin film transistor can achieve better device reliability. In addition, because the present linear polymers can be soluble in solvents that are orthogonal to those typically used to deposit organic semiconducting molecules or polymers, a passivation layer comprising the present linear polymers can be formed via a solution-phase process on top of the source and drain electrodes in a top-contact transistor structure without damaging the organic semiconductor channel region.

Because the present polymers can be photocrosslinked at relatively low curing doses and/or longer wavelengths, they are compatible with a large variety of substrates, including plastic, flexible substrates that have a low photochemical resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be an inexpensive rigid substrate that has relatively low heat and/or chemical resistance. For example, the present organic thin films can be coupled to an inexpensive soda lime glass substrate, as opposed to more expensive and higher heat and/or chemical resistant glass substrates such as quartz and VYCOR®. Substrate-gate materials commonly used in thin-film transistors include doped silicon wafer, tin-doped indium oxide on glass, tin-doped indium oxide on polyimide or mylar film, aluminum or other metals alone or coated on a polymer such as polyethylene terephthalate, a doped polythiophene, and the like.

Accordingly, the present teachings also relate to electronic, optical, or optoelectronic device comprising an organic layer comprising a crosslinked material prepared from at least one of the present polymers, where the organic layer can be in contact or coupled to a semiconductor layer (e.g., an organic or inorganic semiconductor layer) and/or a conductive component (e.g. a metallic contact that functions as either the source, drain, or gate electrode) either directly or via optionally present intervening layer(s) such as a protective or surface modifying interlayer. In various embodiments, the device can be a transistor device, for example an organic thin film transistor (OTFT) (more specifically, an organic field effect transistor (OFET) or an organic light-emitting transistor (OLET)) or a semiconductor oxide thin film transistor (SOTFT). The source and drain electrodes as well as the gate electrode can be made using various deposition techniques. For example, the source and drain electrodes can be deposited through a mask, or can be deposited then etched (e.g., using photolithography). Suitable deposition techniques include electrodeposition, vaporization, sputtering, electroplating, coating, laser ablation and offset printing, from metal or metal alloy including copper, aluminum, gold, silver, platinum, palladium, and/or nickel, or an electrically conductive polymer such as polyethylenethioxythiophene (PEDOT).

An aspect of the present teachings relates to a thin film transistor device including a dielectric layer comprising a dielectric material as described herein, a semiconductor layer, a gate electrode, a source electrode, and a drain electrode. The dielectric layer typically is disposed between the semiconductor layer and the gate electrode. Depending on the device geometry, the source and drain electrodes can be disposed above the semiconductor layer (top-contact), or the semiconductor layer can be disposed above the source and drain electrodes (bottom-contact).

Another aspect of the present teachings relates to methods for fabricating field effect transistors that include a dielectric material of the present teachings. The dielectric materials of the present teachings can be used to fabricate various types of field effect transistors including, but not limited to, top-gate top-contact structures, top-gate bottom-contact structures, bottom-gate top-contact structures, and bottom-gate bottom-contact structures.

In some embodiments, the method can include depositing a dielectric composition according to the present teachings onto a substrate (gate) to form a dielectric layer, wherein the dielectric composition includes one or more polymers described herein dissolved in a first solvent; depositing a semiconducting composition onto the dielectric layer to form a semiconductor layer, where the semiconducting composition includes one or more semiconducting compounds (e.g., small molecule compounds or polymers) dissolved in a second solvent, and where the first solvent and the second solvent are orthogonal solvents; and forming a first electrical contact and a second electrical contact (source and drain) on the semiconductor layer, thereby providing a top-contact bottom-gate organic field effect transistor. The method can include curing the dielectric layer by radiation to induce crosslinking.

In some embodiments, the method can include depositing a dielectric composition according to the present teachings onto a substrate (gate) to form a dielectric layer, wherein the dielectric composition includes one or more polymers described herein dissolved in a first solvent; forming a first electrical contact and a second electrical contact (source and drain) above the dielectric material; and depositing a semiconducting composition above the first and second electrical contacts and the dielectric layer (i.e., to cover the electrical contacts and an area of the dielectric material between the electrical contacts) to form a semiconductor layer, where the semiconducting composition includes one or more semiconducting compounds (e.g., small molecule compounds or polymers) dissolved in a second solvent, and where the first solvent and the second solvent are orthogonal solvents; to provide a bottom-contact bottom-gate organic field effect transistor. The method can include curing the dielectric layer by radiation to induce crosslinking.

In some embodiments, the method can include forming a first electrical contact and a second electrical contact (source and drain) on a substrate; depositing a semiconducting composition above the first and second electrical contacts (i.e., to cover the electrical contacts and an area of the substrate between the electrical contacts) to form a semiconductor layer, where the semiconducting composition includes one or more semiconducting compounds (e.g., small molecule compounds or polymers) dissolved in a first solvent; depositing a dielectric composition according to the present teachings above the semiconductor layer to form a dielectric layer, where the dielectric composition includes one or more polymers described herein dissolved in a second solvent, and where the first solvent and the second solvent are orthogonal solvents; and forming a third electrical contact (gate) above the dielectric material, wherein the third electrical contact is above an area between the first and second electrical contacts, to provide a bottom-contact top-gate organic field effect transistor. The method can include curing the dielectric layer by radiation to induce crosslinking.

In some embodiments, the method can include depositing a semiconducting composition on a substrate to form a semiconductor layer, where the semiconducting composition includes one or more semiconducting compounds (e.g., small molecule compounds or polymers) dissolved in a first solvent; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more polymers described herein dissolved in a second solvent, and where the first solvent and the second solvent are orthogonal solvents; and forming a third electrical contact (gate) above the dielectric material, wherein the third electrical contact is above an area between the first and second electrical contacts, to provide a top-contact top-gate organic field effect transistor. The method can include curing the dielectric layer by radiation to induce crosslinking.

In some embodiments, the method can include depositing a dielectric composition according to the present teachings onto a substrate (gate) to form a dielectric layer, wherein the dielectric composition includes one or more polymers described herein; forming a metal oxide semiconductor layer on the dielectric layer; and forming a first electrical contact and a second electrical contact (source and drain) on the semiconductor layer, thereby providing a top-contact bottom-gate metal oxide field effect transistor. The method can include curing the dielectric layer by radiation to induce crosslinking.

In some embodiments, the method can include depositing a dielectric composition according to the present teachings onto a substrate (gate) to form a dielectric layer, wherein the dielectric composition includes one or more polymers described herein; forming a first electrical contact and a second electrical contact (source and drain) above the dielectric material; and forming a metal oxide semiconductor layer above the first and second electrical contacts and the dielectric layer (i.e., to cover the electrical contacts and an area of the dielectric material between the electrical contacts), to provide a bottom-contact bottom-gate metal oxide field effect transistor. The method can include curing the dielectric layer by radiation to induce crosslinking.

In some embodiments, the method can include forming a first electrical contact and a second electrical contact (source and drain) on a substrate; forming a metal oxide semiconductor layer above the first and second electrical contacts (i.e., to cover the electrical contacts and an area of the substrate between the electrical contacts); depositing a dielectric composition according to the present teachings above the semiconductor layer to form a dielectric layer, where the dielectric composition includes one or more polymers described herein; and forming a third electrical contact (gate) above the dielectric material, wherein the third electrical contact is above an area between the first and second electrical contacts, to provide a bottom-contact top-gate metal oxide field effect transistor. The method can include curing the dielectric layer by radiation to induce crosslinking.

In some embodiments, the method can include forming a metal oxide semiconductor layer on a substrate; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more polymers described herein; and forming a third electrical contact (gate) above the dielectric material, wherein the third electrical contact is above an area between the first and second electrical contacts, to provide a top-contact top-gate metal oxide field effect transistor. The method can include curing the dielectric layer by radiation to induce crosslinking.

The semiconductor layer and the various electrical contacts can be formed by various deposition processes known to those skilled in the art. For example, the semiconductor layer can be formed by processes such as, but not limited to, sputtering, ion-assisted deposition (IAD), physical vapor deposition, different types of printing techniques (e.g., flexo printing, litho printing, gravure printing, ink-jetting, pad printing, and so forth), drop casting, dip coating, doctor blading, roll coating, and spin-coating. In preferred embodiments, the semiconductor layer is formed from a solution-phase process such as spin-coating, slot coating, or printing. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

Yet another aspect of the present teachings relates to methods for fabricating field effect transistors that include a surface-modifying layer of the present teachings. For example, the method can include depositing a surface modifier composition onto a substrate (e.g., glass), wherein the surface modifier composition includes one or more polymers described herein, prior to formation of the source and drain contacts, formation of the semiconductor layer, formation of the gate dielectric layer, and formation of the gate contact (regardless of sequence of these steps as required by the desired configuration). The method can include curing the dielectric layer by radiation to induce crosslinking.

A further aspect of the present teachings relates to methods for patterning the semiconductor layer in a field effect transistor using a photoresist of the present teachings. For example, the method can include depositing a composition including one or more polymers of the present teachings over at least a portion of a semiconductor layer to form a photoresist; crosslinking the photoresist by exposing the photoresist to radiation through a photomask; removing unexposed portions of the photoresist using one or more developers to reveal a portion of the semiconductor layer; etching the revealed portion of the semiconductor layer; and stripping the photoresist to provide a patterned semiconductor layer.

The following examples are provided to illustrate further and to facilitate the understanding of the present teachings and are not in any way intended to limit the invention.

Example 1

Polymer Synthesis

Example 1a

Synthesis of P(DM-CydEMA)

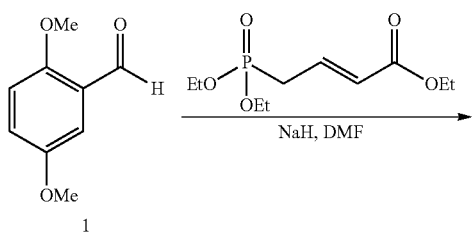

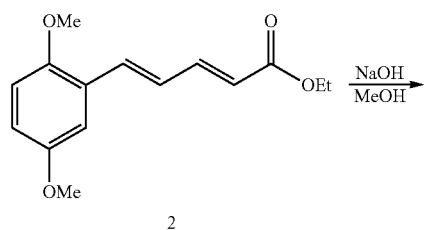

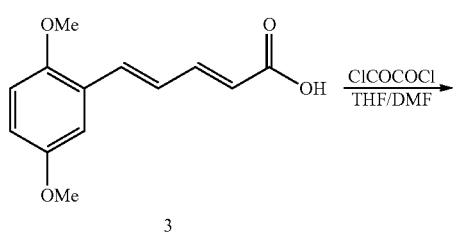

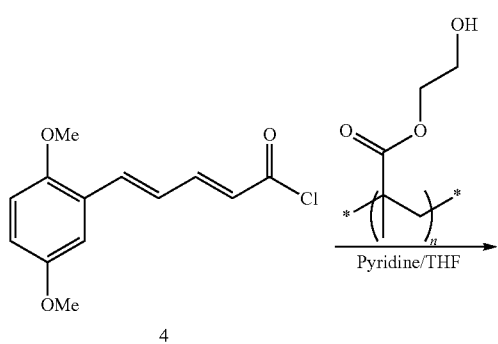

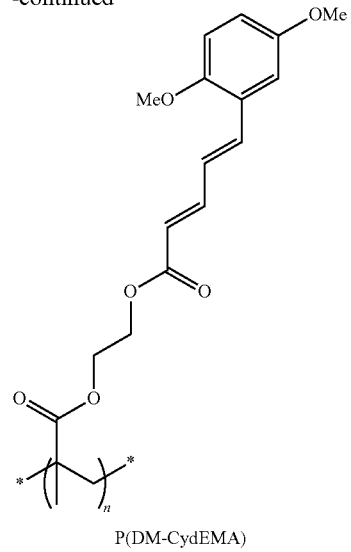

P(DM-CydEMA)

Step 1: Preparation of 2 (ethyl dimethoxy-cinnamylideneacetate)

To a suspension of NaH (60% dispersion in mineral oil, 1.39 g, 34.75 mmol) in 30 mL of anhydrous DMF was slowly added a solution of triethyl 4-phosphonocrotonate (7.7 mL, 34.75 mmol) in anhydrous DMF (20 mL). The resulting mixture was stirred at room temperature for 30 min under nitrogen and then a solution of 1 (2,5-dimethoxybenzaldehyde) (5.25 g, 31.59 mmol) in 20 mL of anhydrous DMF was added. The reaction mixture was stirred at room temperature for 15 h and then quenched with water. Ethyl acetate was added and the organic phase was separated, dried over $Na_2SO_4$, concentrated on the rotary evaporator to yield the crude compound as a yellow oil. The crude was purified by column chromatography (silica gel, hexanes:ethyl acetate (4:1, v/v)) to give compound 2 (ethyl dimethoxy-cinnamylideneacetate) as a bright yellow solid (6.23 g, 75.1% yield).

$^1$H NMR (500 MHz, $CDCl_3$): δ 7.48 (dd, 1H, J=7.5 Hz, 11.5 Hz), 7.22 (d, 1H, J=15.5 Hz), 7.05 (d, 1H, J=2.0 Hz), 6.89 (m, 3H), 5.96 (d, 1H, J=15.5 Hz), 4.23 (q, 2H) 3.90 (s, 3H), 3.80 (s, 3H), 1.32 (t, 3H).

Step 2: Preparation of 3 (dimethoxy-cinnamylideneacetic acid)

Compound 2 (ethyl dimethoxy-cinnamylideneacetate) (6.0 g, 22.87 mmol) was suspended in 120 mL of methanol (MeOH) and treated with a solution of NaOH in water (2.29 M, 25.0 mL). The reaction mixture was heated under reflux for 4 h, cooled to room temperature, and then treated with 12.0 mL of conc. aq. HCl in 50 mL of water. The resulting mixture was stirred for 5 min to yield a bright yellow solid, which was filtered, washed with water, and dried overnight in a vacuum oven (P=20 Torr) at 70° C. Compound 3 (dimethoxy-cinnamylideneacetic acid) was obtained as a bright yellow solid (3.55 g, 66% yield).

$^1$H NMR (500 MHz, $CDCl_3$): δ 7.58 (dd, 1H, J=7.0 Hz, 11.5 Hz), 7.31 (d, 1H, J=15 Hz), 7.07 (d, 1H, J=2.0 Hz), 6.84 (m, 3H), 5.98 (d, 1H, J=15 Hz), 3.86 (s, 3H), 3.82 (s, 3H).

Step 3: Preparation of 4 (dimethoxy-cinnamylideneacetyl chloride)

Compound 3 (dimethoxy-cinnamylideneacetic acid) (3.05 g, 13.02 mmol) was dissolved in 60.0 mL of anhydrous THF, and treated with oxalyl chloride (1.36 mL, 15.62 mmol) and 6 drops of DMF, respectively. The reaction mixture was stirred at room temperature for 4 h, then concentrated on a rotary evaporator to remove all the volatiles. Compound 4 (dimethoxy-cinnamylideneacetyl chloride) was obtained as a dark yellow solid (3.0 g, 91.2% yield).

$^1$H NMR (500 MHz, CDCl$_3$): δ 7.63 (dd, 1H, J=8.5 Hz, 11.5 Hz), 7.42 (d, 1H, J=15 Hz), 7.06 (d, 1H, J=3.0 Hz), 6.95 (m, 2H), 6.85 (d, 1H, J=8.5 Hz), 6.17 (d, 1H, J=15 Hz), 3.86 (s, 3H), 3.82 (s, 3H).

Step 4: Preparation of poly(dimethoxy-cinnamylideneacetylethylmethacrylate) [P(DM-CydEMA)]

Poly(hydroxyethyl methacrylate) (1.19 g, M$_w$=20,000 g/mol, hydroxy group: 9.14 mmol) was dissolved in 5.0 mL of anhydrous pyridine. A solution of 4 (dimethoxy-cinnamylideneacetyl chloride) (3.0 g, 11.87 mmol) in 10.0 mL of anhydrous THF was slowly added to this polymer solution. The reaction mixture was stirred at room temperature overnight, then precipitated into ~100 mL of ice-cooled methanol (MeOH). The polymer precipitates were collected and purified by two additional dissolution-precipitation steps (THF/MeOH) to yield 2.69 g of poly(dimethoxy-cinnamylideneacetylethylmethacrylate) [P(DM-CydEMA)] as a yellow solid (85% yield).

$^1$H NMR (500 MHz, CDCl$_3$): δ 7.44 (m, broad, 1H), 7.18 (m, broad, 1H), 7.03 (m, broad, 1H), 6.90 (m, broad, 1H), 6.78 (m, broad, 2H), 5.94 (m, broad, 1H), 4.29 (s, broad, 2H), 4.16 (s, broad, 2H), 3.76 (d, sharp, 6H), 1.90-0.86 (m, 5H).

Example 1b

Synthesis of P(DM-Cyd/Acetyl(0.8:0.2)EMA)

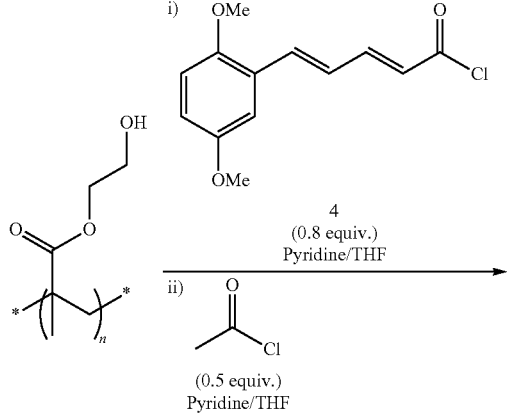

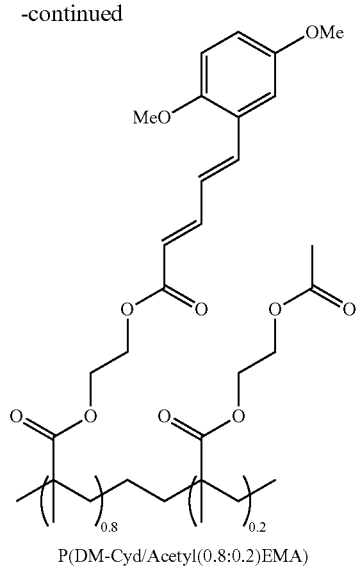

P(DM-Cyd/Acetyl(0.8:0.2)EMA)

Poly(hydroxyethyl methacrylate) (1.0 g, M$_w$=20,000 g/mol, hydroxy group: 7.68 mmol) was dissolved in 5.0 mL of anhydrous pyridine. A solution of 4 (dimethoxy-cinnamylideneacetyl chloride) (1.55 g, 6.14 mmol, 0.8 equiv.) in 10.0 mL of anhydrous THF was slowly added to this polymer solution. The reaction mixture was stirred at room temperature overnight, and then a solution of acetyl chloride (0.3 g, 3.84 mmol, 0.5 equiv.) in THF was added, and the reaction was stirred for an additional 10 h. The reaction mixture was precipitated into ~100 mL of ice-cooled methanol (MeOH). The polymer precipitates were collected and purified by two additional dissolution-precipitation steps (THF/MeOH) to yield poly(dimethoxy-cinnamylideneacetyl/acetyl(0.8:0.2) ethylmethacrylate) P(DM-Cyd/Acetyl(0.8:0.2)EMA) as a yellow solid.

Example 1c

Synthesis of P(CydEMA)

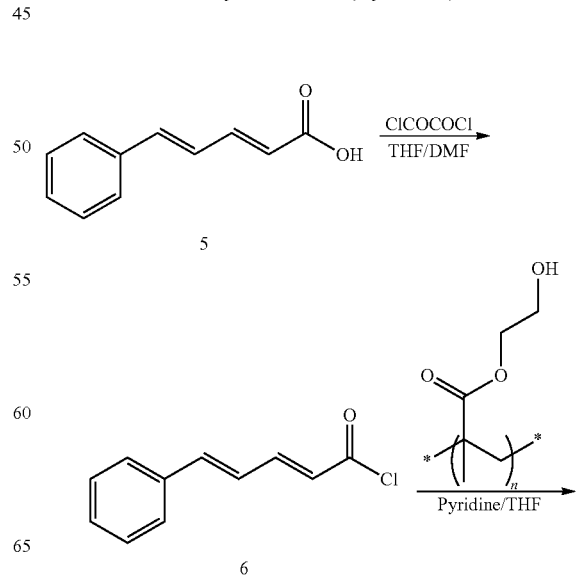

57

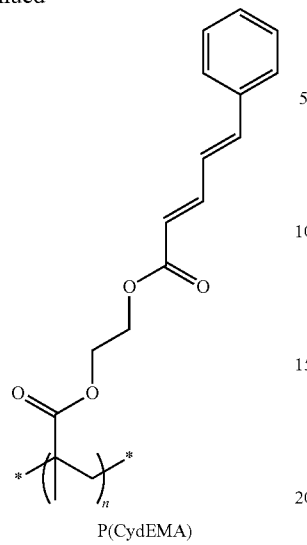

P(CydEMA)

Step 1: Preparation of 6 (cinnamylideneacetyl chloride)

Compound 5 (cinnamylideneacetic acid) (5.0 g, 28.7 mmol) was dissolved in 90.0 mL of anhydrous THF, and treated with oxalyl chloride (3.0 mL, 34.3 mmol) and 3 drops of DMF. The reaction mixture was stirred at room temperature for 4 h and then concentrated on a rotary evaporator to remove all the volatiles. Compound 6 (cinnamylideneacetyl chloride) was obtained as a pale yellow solid (5.0 g, 90.4% yield).

$^1$H NMR (500 MHz, CDCl$_3$): δ 7.65 (dd, 1H, J=7.5 Hz, 11.5 Hz), 7.54 (d, 1H, J=2.0 Hz), 7.53 (d, 1H, J=2.0 Hz), 7.44 (m, 3H), 7.11 (d, 1H, J=15.0 Hz), 6.95 (dd, 1H, J=7.5 Hz, 11.5 Hz), 6.21 (d, 1H, J=12.5 Hz).

Step 2: Preparation of poly(cinnamylideneacetylethylmethacrylate) [P(CydEMA)]

Poly(hydroxyethyl methacrylate) (1.56 g, M$_w$=20,000 g/mol, hydroxy group: 11.99 mmol) was dissolved in 5.0 mL of anhydrous pyridine. A solution of 6 (cinnamylideneacetyl chloride) (3.0 g, 15.57 mmol) in 10.0 mL of anhydrous THF was slowly added to this polymer solution. The reaction mixture was stirred at room temperature overnight, then precipitated into ~100 mL of ice-cooled methanol (MeOH). The polymer precipitates were collected and purified by two additional dissolution-precipitation steps (THF/MeOH) to yield 3.32 g of poly(cinnamylideneacetylethylmethacrylate) [P(CydEMA)] as a pale yellow solid (80% yield).

$^1$H NMR (500 MHz, CDCl$_3$): δ 7.44 (d, broad, 3H), 7.31 (d, broad, 3H), 6.87 (s, broad, 2H), 5.98 (m, broad, 1H), 4.29 (s, broad, 2H), 4.17 (s, broad, 2H), 1.95-0.90 (m, 5H). Anal. calcd for C$_{17}$H$_{18}$O$_4$: C, 71.31; H, 6.34; N, 0.00. found: C, 71.06; H, 6.45; N, 0.00. GPC(RT in THF): M$_n$=14,051 g mol$^{-1}$, M$_w$=26,095 g mol$^{-1}$, and PDI=1.86 (against PS standard).

58

Example 1d

Synthesis of P(Cyd/Acetyl(0.9:0.1)EMA)

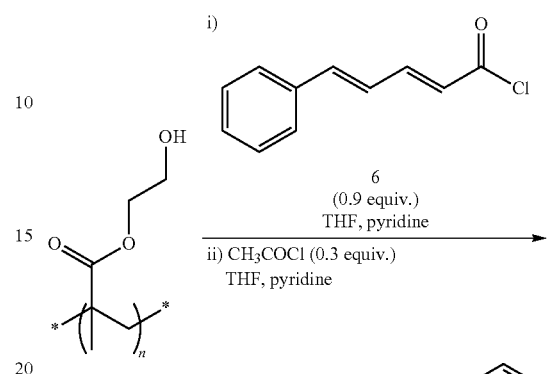

P(Cyd/Acetyl(0.9:0.1)EMA)

Poly(hydroxyethyl methacrylate) (0.75 g, M$_w$=20,000 g/mol, hydroxy group: 5.76 mmol) was dissolved in 5.0 mL of anhydrous pyridine. A solution of 6 (cinnamylideneacetyl chloride) (1.00 g, 5.19 mmol, 0.9 equiv.) in 2.0 mL of anhydrous THF was slowly added to this polymer solution. The reaction mixture was stirred at room temperature overnight, and then a solution of acetyl chloride (0.136 g, 1.73 mmol, 0.3 equiv.) in 1.0 mL of anhydrous THF was added, and the reaction was stirred for an additional 24 h. The reaction mixture was precipitated into ~100 mL of ice-cooled methanol (MeOH). The polymer precipitates were collected and purified by two additional dissolution-precipitation steps (THF/MeOH) to yield poly(cinnamylideneacetyl/acetyl(0.9:0.1) ethylmethacrylate) P(Cyd/Acetyl(0.9:0.1)EMA) as an off-white solid (1.0 g, 63%).

$^1$H NMR (500 MHz, CDCl$_3$): δ 7.44 (d, broad, 3H), 7.31 (d, broad, 3H), 6.87 (s, broad, 2H), 5.98 (m, broad, 1H), 4.30 (s, broad, 2H), 4.16 (s, broad, 2H), 2.01 (s, broad, ~0.1H), 1.95-0.90 (m, 5H).

Example 1e

Synthesis of P(Cyd/Acetyl EMA)

Step 1: (2E,4E)-5-phenylpenta-2,4-dienoic acid (5, 300.0 g, 1.7 mol) was suspended in anhydrous dichloromethane (954 g) at 20° C. Oxalyl chloride (264.0 g, 2.1 mol) was added slowly over a course of 92 mins, followed by addition of anhydrous DMF (0.2 g) carefully. This mixture was stirred at 20° C. for another 5.5 h, before all the volatiles were removed in vacuo (pressure from 1024 mbar to 20 mbar), with temperature at lower than 40° C. The crude product (333.9 g) was obtained and it was used directly in the next step without further purification.

Step 2: Under nitrogen, poly(hydroxyethyl methacrylate) (100.0 g, 0.77 mol) was dissolved in anhydrous pyridine (121.7 g) and anhydrous THF (258 g) with stirring. A solution of (2E,4E)-5-phenylpenta-2,4-dienoic acid chloride (6, 170 g, 0.88 mol) from Step 1 in anhydrous THF (204 g) was added slowly over a course of 60 mins, with the reaction temperature maintained at 10° C. The resulting reaction mixture was stirred under nitrogen at 20° C. for additional 4 h. Acetyl chloride (9.0 g, 0.11 mol) was then added slowly over a course of 9 mins at 10° C., and this mixture was kept stirring at 20° C. overnight, before it was filtered to remove the precipitate. The filter cake was washed with THF (100 g). The combined filtrate was concentrated to about 600 g, and this solution was precipitated in methanol (5 L with 0.15 g monomethyl ether hydroquinone, MEHQ). The precipitate was collected by filtration and washed with methanol (420 mL) and dried in vacuum, leading to a crude product (199 g). A portion of this crude product (132 g) was dissolved in dichloromethane (1060 g), and the resulting solution was washed with deionized water (400 g×3), and the organic layer was concentrated to about 300 g to give a clear solution, which was diluted with dichloromethane to about 650 g and filtered. This solution (630 g) was then precipitated in pentane (5 L with 0.1 g MEHQ), and the precipitate was collected by filtration, washed with methanol (420 mL with 0.1 g MEHQ, two times), and dried in vacuum (10 mbar) at 60° C., leading to a slightly yellow powder as the final product.

Example 1f

Synthesis of P(SMe-CydEMA)

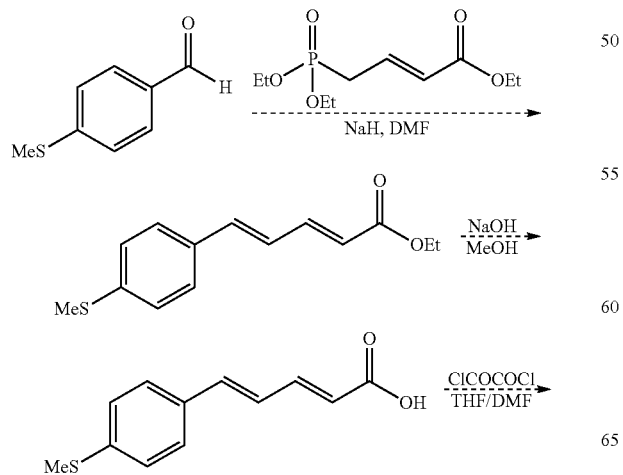

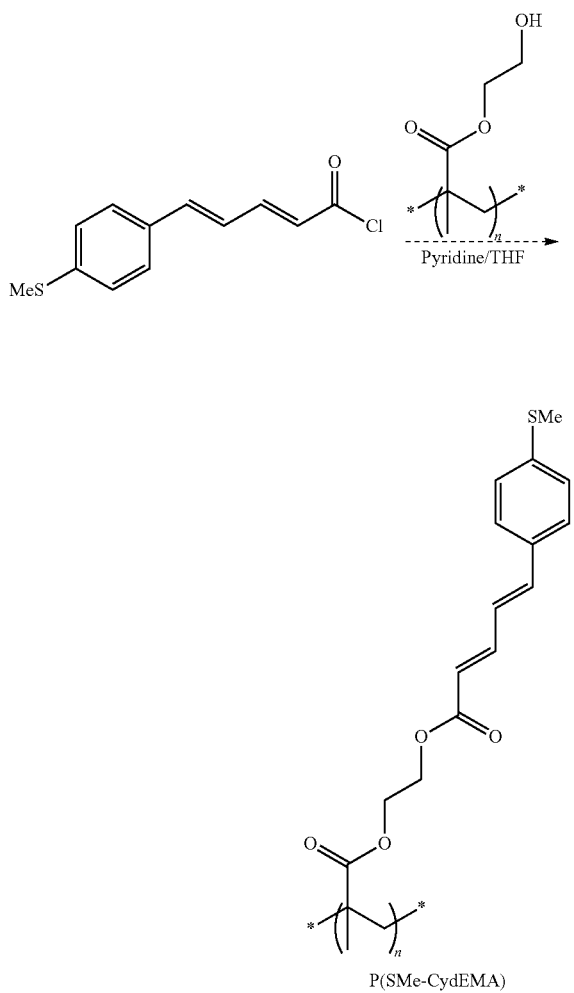

Poly(p-methythio-cinnamylideneacetylethylmethacrylate) can be synthesized using procedures that are analogous to those described in Example 1a from p-methythio-cinnamylideneacetic acid, which can be prepared according to the synthetic scheme above.

Example 1g

Synthesis of P(Cyd-CO-EMA)

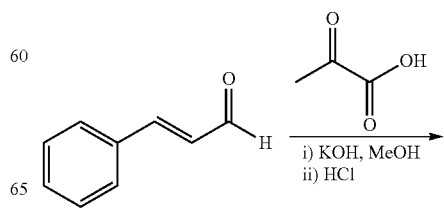

-continued

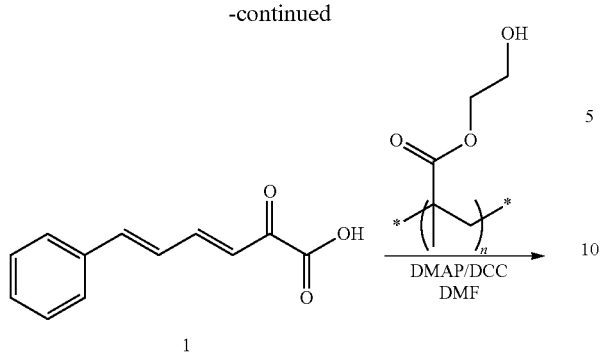

Step 1: Preparation of 1(cinnamylidene-carbonyl-acetic acid)

To a solution of pyruvic acid (7.0 g, 0.079 mol), trans-cinnamaldehyde (10.5 g, 0.079 mol) in MeOH (10 mL) at 0° C. was added a solution of KOH (6.65 g, 0.118 mol) in MeOH (20 mL) portion-wise over 30 minutes. The resulting reaction mixture was stirred at 40° C. for 1 hour and at room temperature overnight. The yellow precipitate was collected by vacuum filtration, washed with MeOH, suspended in water, and acidified with 0.1 M HCl yielding a clear yellow solution. The acidified aqueous solution was extracted with ethyl acetate, dried over $Na_2SO_4$ and concentrated in vacuo to yield compound 1 as a yellow product (10 g, 62%). $^1$H NMR (500 MHz, $CDCl_3$): δ 7.79 (dd, 1H, J=9.0 Hz, 11.0 Hz), 7.03-7.23 (m, 2H), 7.42-7.62 (m, 6H).

Step 2: Preparation of poly(cinnamylidene-carbonyl-ethylmethacrylate) [P(Cyd-CO-EMA)]

Poly(hydroxyethyl methacrylate) (0.096 g, Mw=20,000 g/mol, hydroxy group: 0.742 mmol) and cinnamylidene-carbonyl-acetic acid (0.15 g, 0.742 mmol) were dissolved in DMF (2 mL), and DMAP (4.8 mg, w/w 5%) was added to this solution. The solution was stirred at room temperature for 2 hours, and DCC (0.17 mg, 0.816 mmol) was added. The resulting reaction mixture was stirred at room temperature for 18 hours, and precipitated into methanol (MeOH) to yield the polymer as a yellow product (130 mg, 59%).

Example 1h

Synthesis of Additional Polymers

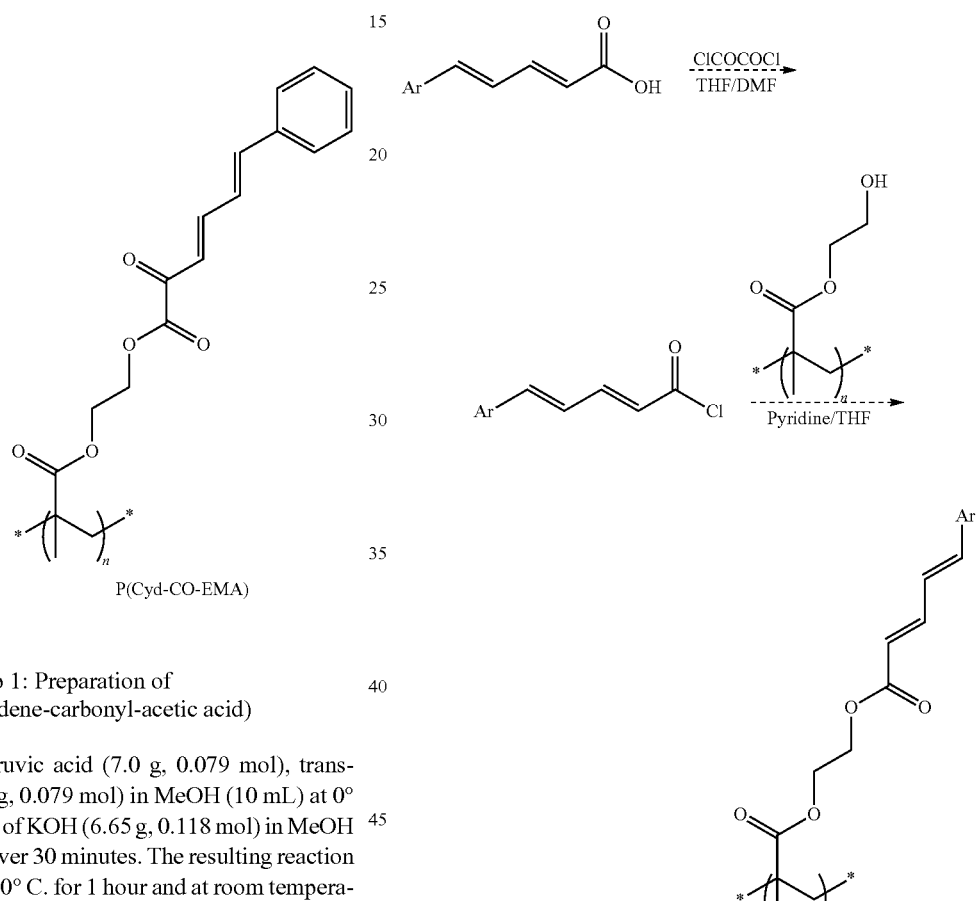

Additional polymers according to the present teachings can be prepared using procedures that are analogous to those described in Example 1c from commercially available carboxylic acids as shown in the scheme above.

Example 2

Solubility Data Comparison

Homopolymers and copolymers according to the present teachings were dissolved in common organic solvents, for example, anisole and acetates such as propylene glycol methyl ether acetate, ethyl lactate, and n-butylacetate, and their solubility data were compared (Table 1). Specifically, it was unexpectedly found that the presence of the repeating unit of Formula (Ib), even at relatively low molar ratios (e.g., about 10 mol. %) can shorten the dissolution time significantly. For example, at high concentrations such as about 900 mg/mL, the copolymer P(Cyd/Acetyl(0.9:0.1)EMA) was observed to have dissolved completely in about 60 seconds, while the homopolymer (P(CydEMA)) took about 25 minutes to dissolve completely with stirring.

of the chromophoric unit of certain embodiments of the present polymers was measured and compared to that of certain prior art polymers.

TABLE 1

| | P(CydEMA) | | | | P(Cyd/Acetyl(0.9:0.1)EMA) | | | |
|---|---|---|---|---|---|---|---|---|
| Exp. # | 1 | 2 | 3 | 4 | 1 | 2 | 3 | 4 |
| Concentration (mg/mL) | 500 | 600 | 700 | 900 | 500 | 600 | 700 | 900 |
| Complete dissolution time | 3 min | 6 min | 10 min | 25 min | 30 s | 30 s | 30 s | 60 s |

Example 3

Tunability of Photocrosslinking Wavelengths

Without wishing to be bound by any particular theory, it is believed that a lower bandgap energy (Eg) as determined by molecular orbital (MO) calculations suggests a longer maximum absorption wavelength. MO calculations for the chromophoric unit of certain embodiments of the present polymers were performed and compared with that of certain prior art polymers. Specifically, geometry optimizations and electronic structure calculations for the gas-phase neutral states of the compounds listed in Table 2 were carried out by density functional theory (DFT) calculations at the B3LYP/6-31G** level of theory using Spartan PC (Spartan '08, Version 1.0.0, Wavefunction, Inc.). The maximum absorption wavelength

TABLE 2

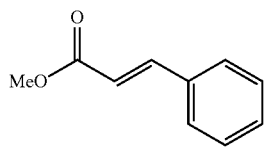 [SMILES: COC(=O)/C=C/c1ccccc1]

theoretical Eg = 4.64 eV exp. max ~277 nm

TABLE 2-continued

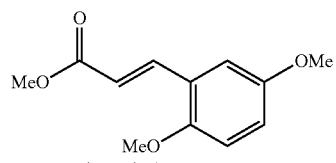

theoretical Eg = 4.02 eV exp. max ~276, 356 nm

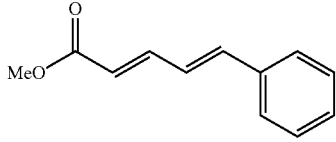 [SMILES: COC(=O)/C=C/C=C/c1ccccc1]

theoretical Eg = 3.91 eV exp. max ~311 nm

TABLE 2-continued

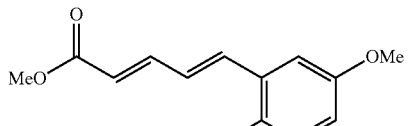

theoretical Eg = 3.59 eV
exp. max ~303, 368 nm

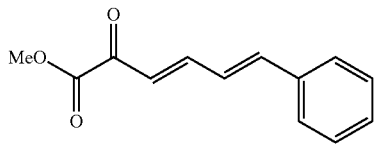 [SMILES: COC(=O)C(=O)/C=C/C=C/c1ccccc1]

theoretical Eg = 3.44 eV

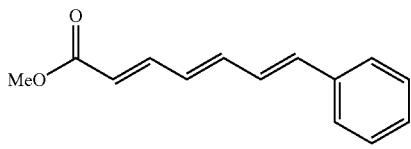 [SMILES: COC(=O)/C=C/C=C/C=C/c1ccccc1]

theoretical Eg = 3.41 eV

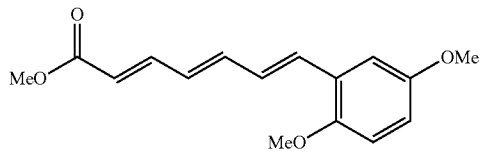 [SMILES: COC(=O)/C=C/C=C/C=C/c1cc(OC)ccc1OC]

theoretical Eg = 3.21 eV

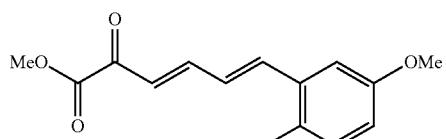

theoretical Eg = 3.08 eV

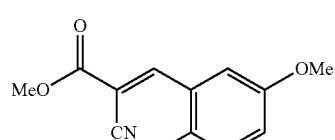

theoretical Eg = 3.58 eV

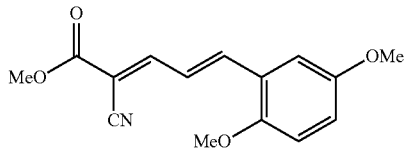 [SMILES: COC(=O)/C(C#N)=C/C=C/c1cc(OC)ccc1OC]

theoretical Eg = 3.23 eV

Example 4

Device Fabrication and Characterization

Example 4a

Curing Dose Comparison

Top-gate bottom contact TFTs were fabricated using P(DM-CydEMA) or P(CydEMA) as the gate dielectric material. Control devices were fabricated using poly(dimethoxycinnamoylethylmethacrylate) [P(DM-CyEMA)] and poly(cinnamoylethylmethacrylate) [P(CyEMA)].

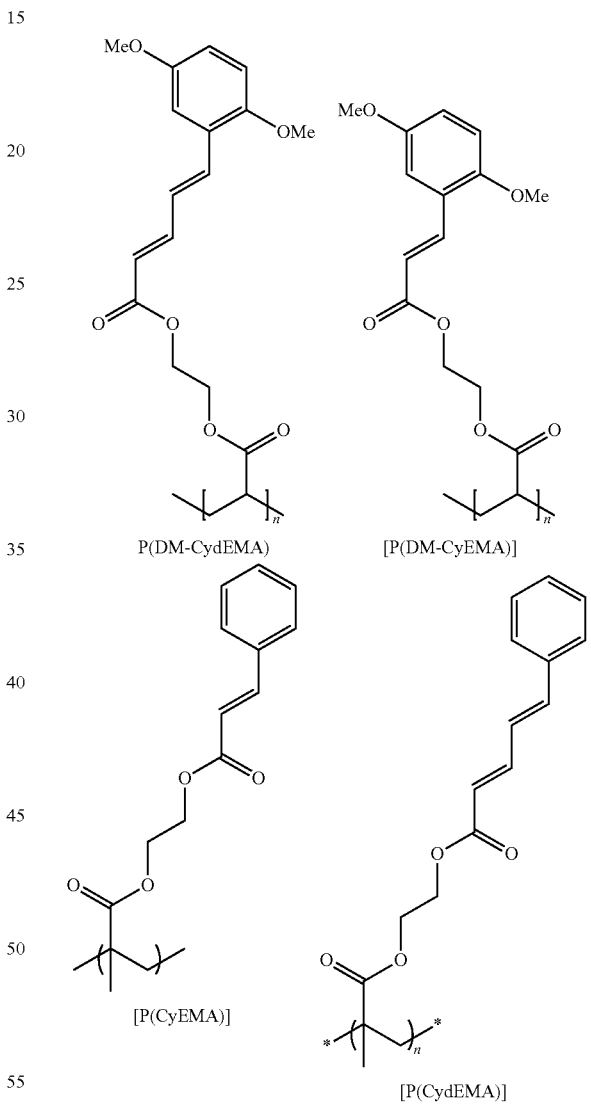

Polyethylene naphthalate (PEN) films with a spin-coated surface modifier layer were used as substrates. Prior to deposition of the semiconductor layer, 500 Å silver (Ag) source/drain electrodes were defined by conventional photolithography process. The channel lengths and widths are 10 μm and 1000 μm, respectively. The transistor channel and electrodes were modified using a thiol treatment process. A PDICN$_2$-based semiconductor layer (80 nm) was deposited by spin-coating. The OSC layer was annealed for 5 minutes at 120° C. to remove solvent residues. Thin dielectric films of P(DM- CydEMA) or P(CydEMA) having a thickness of about 550 nm or about 500 nm were then spin-coated, exposed to a 365-nm UV lamp for crosslinking at various curing doses, then baked on a hot plate at about 120° C. or about 150° C. for 5 minutes. The TFTs were completed by vapor deposition of a 300 Å silver (Ag) gate electrode onto the dielectric layer through a stencil mask with good registration to the transistor channels. Mobilities ranging between about 0.4 cm²/Vs and about 0.8 cm²/Vs were obtained, with turn-on voltages between about 0 V and about −5 V, and on-off current ratios of $10^5$~$10^7$.

Figure 3:
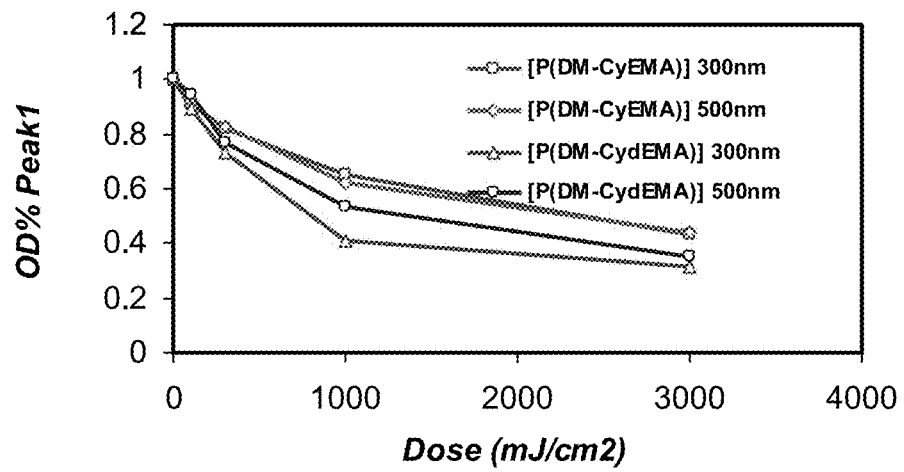
FIG. 3 compares the curing speeds of P(DM-CydEMA) versus a comparative polymer [P(DM-CyEMA)] at two different peaks: (a) Peak 1 refers to $\lambda_{max}$=303 nm for P(DM-CydEMA) and $\lambda_{max}$=278 nm for P(DM-CyEMA), and (b) Peak 2 refers to $\lambda_{max}$=368 nm for P(DM-CydEMA) and $\lambda_{max}$=357 nm for P(DM-CyEMA).
Figure 3:
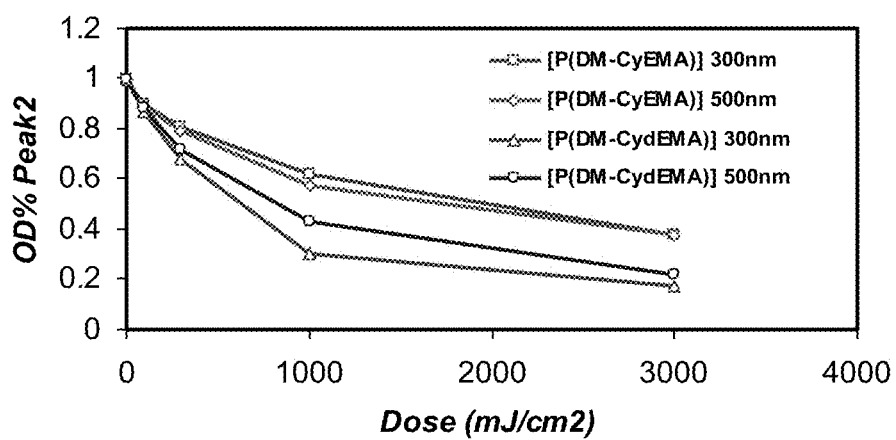

FIG. 3 compares the curing speed of P(DM-CydEMA) versus [P(DM-CyEMA)]. It can be seen that it is possible to achieve the same level of crosslinking but at a much lower curing dose when comparing P(DM-CydEMA) to [P(DM-CyEMA)]. Specifically, using the normalized arbitrary unit of 0.8 (which is inversely proportional to the level of crosslinking), [P(DM-CyEMA)] requires a curing dose of 1000 mJ, while P(DM-CydEMA) can use a curing dose as low as 300 mJ.

Figure 4:
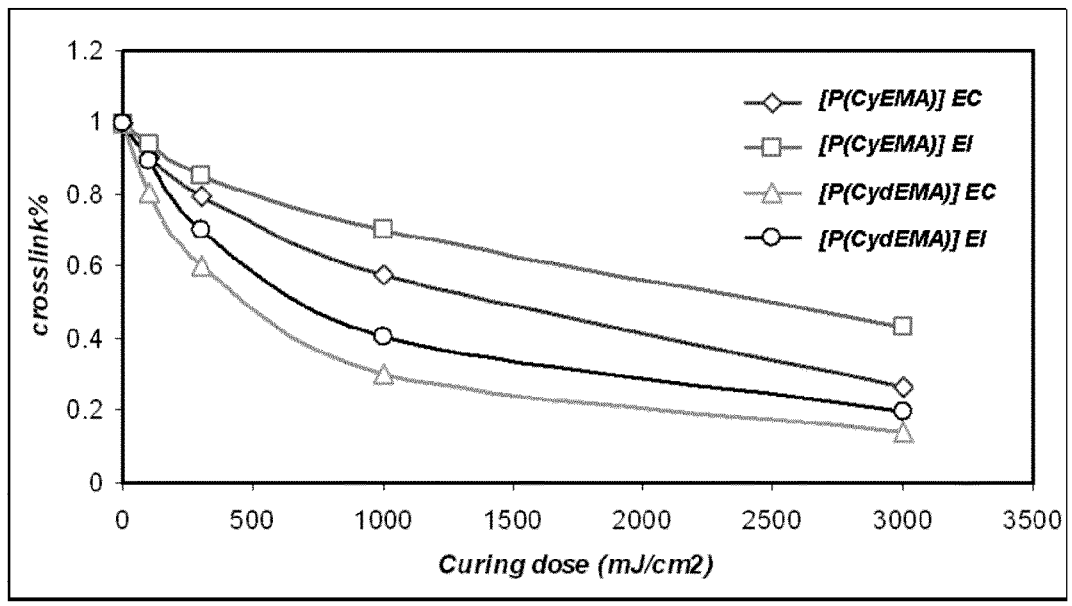
FIG. 4 compares the curing speeds of P(CydEMA) versus a comparative polymer [P(CyEMA)].

Similar observations can be made in FIG. 4, which compares the curing speed of P(CydEMA) versus [P(CyEMA)]. Using the normalized arbitrary unit of 0.75, [P(CyEMA)] requires a curing dose of 1000 mJ, while P(CydEMA) can use a curing dose as low as 300 mJ.

Example 4b

Positive Bias Thermal Stress Tests

To study the resistance against electrical and thermal stress of the present polymers, top-gate bottom contact TFTs were fabricated using [P(CydEMA)] or P(DM-CydEMA) as the dielectric layer, and compared against those fabricated using [P(DM-CyEMA)] or a commercially available epoxy material as the dielectric layer. P(DM-CydEMA), [P(CydEMA)], and [P(CyEMA)] were UV-cured at 300 mJ/cm² while the commercial available epoxy material was UV-cured at 150 mJ/cm².

To obtain Positive Bias Temperature Stress (PBTS) data, the TGBC devices were first subjected to constant substrate heating of about 60° C.; at the same time, the gate electrode was constantly kept at about 30V while both source and drain electrodes were grounded. After 250 s, the $I_d V_g$ plot was captured and the bias stress was repeated for 2 more cycles to provide a stressing period of at least 750 s in total (1500 s for the [P(CydEMA)] devices).

Figure 5:
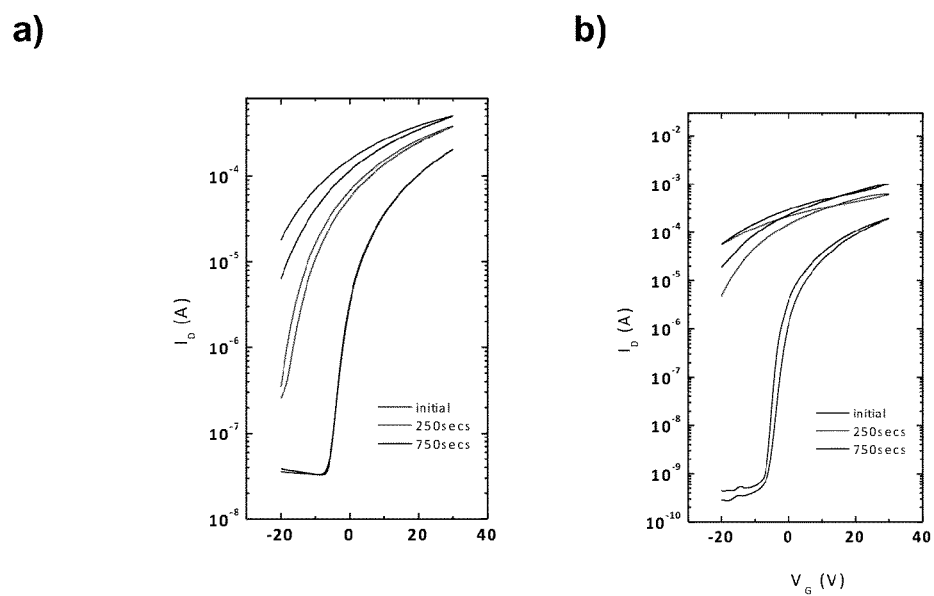
FIG. 5 shows representative $I_d$ versus $V_g$ plots of top-gate bottom-contact TFTs incorporating the following organic materials as the gate dielectric: (a) P(DM-CydEMA) and (b) comparative polymer P(DM-CyEMA).
Figure 6:
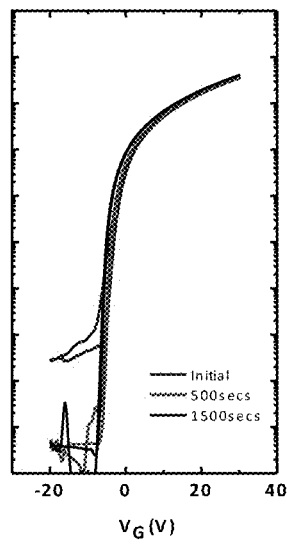
FIG. 6 shows representative $I_d$ versus $V_g$ plots of top-gate bottom-contact TFTs incorporating the following organic materials as the gate dielectric: (a) P(CydEMA) cured at 300 mJ/cm² and post-baked at 110° C. and (b) P(CydEMA) cured at 300 mJ/cm² and post-baked at 135° C.
Figure 6:
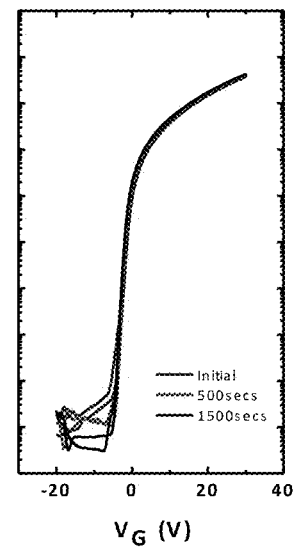

Referring to FIGS. 5a-b, it can be seen that P(DM-CydEMA) shows about a ~3× times improvement in terms of PBTS compared to [P(DM-CyEMA)]. Also, referring to FIGS. 6a-b, the P(CydEMA) devices show negligible hysteresis over a stressing period of 1500 s. Furthermore, by slightly increasing the post baking temperature from 110° C. to 135° C., the P(CydEMA) devices could achieve close to 0V $V_{TH}$ shift in PBTS.

Figure 7:
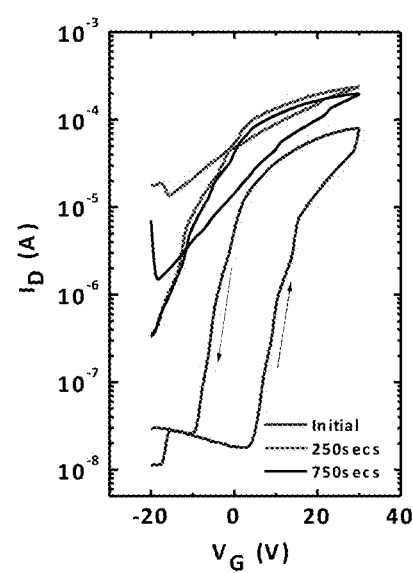
FIG. 7 shows representative $I_d$ versus $V_g$ plots of top-gate bottom-contact TFTs incorporating a commercially available epoxy-based dielectric material as the gate dielectric.

By comparison, it can be seen from FIG. 7 that the commercially available epoxy material shows significant anticlockwise hysteresis.

All publications, patent applications, patents, and other references mentioned herein are incorporated by reference in their entirety. In case of conflict, the present specification, including definitions, controls.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An electronic device comprising a field-effect transistor having a semiconductor layer comprising a semiconducting electronic material, a dielectric layer comprising an insulating electronic material, and source, drain, and gate electrodes each comprising a conducting electronic material, wherein the field-effect transistor comprises:
an organic material comprising a crosslinked matrix of a polymer, the polymer comprising a first repeating unit of Formula (Ia) and optionally a second repeating unit of Formula (Ib) that is different from the first repeating unit of Formula (Ia):

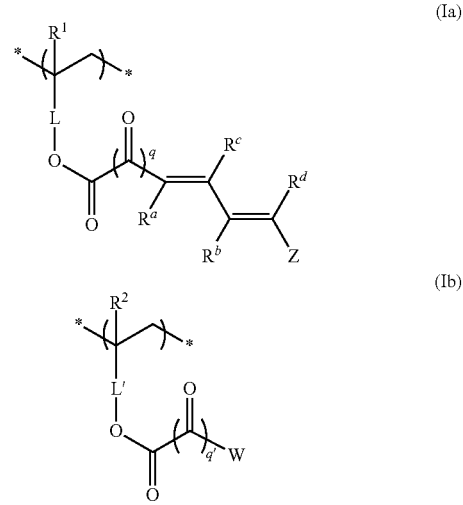

wherein:
L and L' independently are absent or a divalent linker;
W is $-(CR^{a'}=CR^{c'})_p-(CR^{b'}=CR^{d'})_p-Z'$,
Z is selected from the group consisting of a $C_{1-10}$ alkyl group, a $C_{1-10}$ haloalkyl group, a substituted or unsubstituted $C_{6-14}$ aryl group, and a substituted or unsubstituted 5-14 membered heteroaryl group;
Z' is selected from the group consisting of H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group;
$R^1$ and $R^2$ independently are H or $CH_3$;
$R^a$, $R^{a'}$, $R^b$ and $R^{b'}$ independently are selected from the group consisting of H, F, Cl, CN, $CH_3$, and $CF_3$;
$R^c$, $R^{c'}$, $R^d$ and $R^{d'}$ independently are selected from the group consisting of H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group;
p and p' independently is 0 or 1; and
q and q' independently is 0 or 1;
wherein either the dielectric layer comprises the organic material as the insulating electronic material or the organic material is in contact with at least one of the electronic materials.

2. The electronic device of claim 1, wherein L is absent or selected from the group consisting of $-C_6H_5-$, $-Y-$, and —C(O)O—Y—, wherein Y is selected from the group consisting of a divalent $C_{1-10}$ alkyl group and a divalent $C_{1-10}$ haloalkyl group.

3. The electronic device of claim 1, wherein the first repeating unit of Formula (Ia) is selected from the group consisting of:

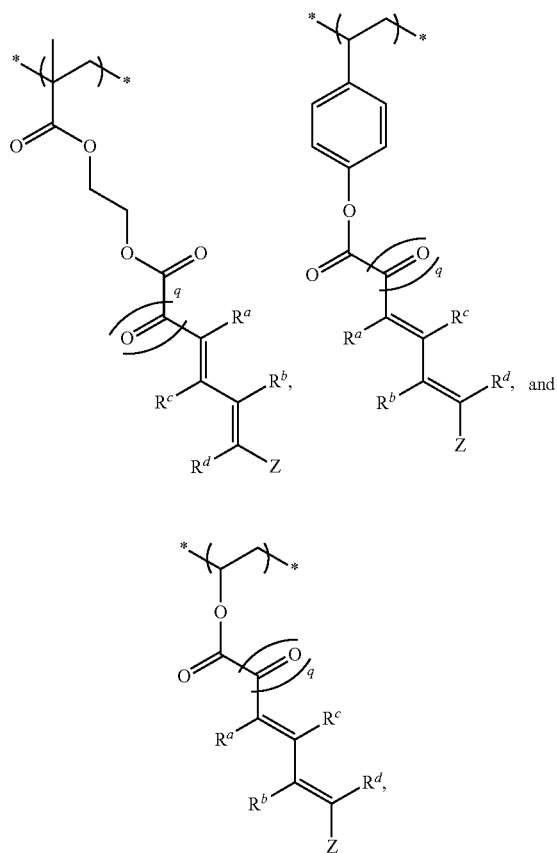

wherein $R^a$, $R^b$, $R^c$, $R^d$, Z and q are as defined in claim 1.

4. The electronic device of claim 3, wherein Z is an unsubstituted $C_{6-14}$ aryl group.

5. The electronic device of claim 3, wherein Z is a $C_{6-14}$ aryl group substituted with 1-5 groups independently selected from the group consisting of a halogen, CN, $R^e$, —O—$R^e$, —S—$R^e$, —C(O)—$R^e$, and —C(O)—O—$R^e$, wherein $R^e$, at each occurrence, is selected from the group consisting of a $C_{1-10}$ alkyl group, a $C_{1-10}$ haloalkyl group, a $C_{2-10}$ alkenyl group, and a $C_{2-10}$ alkynyl group.

6. The electronic device of claim 3, wherein Z is an unsubstituted 5-14 membered heteroaryl group.

7. The electronic device of claim 3, wherein Z is a 5-14 membered heteroaryl group substituted with 1-5 groups independently selected from the group consisting of a halogen, CN, oxo, $R^e$, —O—$R^e$, —S—$R^e$, —C(O)—$R^e$, and —C(O)—O—$R^e$, wherein $R^e$, at each occurrence, is selected from the group consisting of a $C_{1-10}$ alkyl group, a $C_{1-10}$ haloalkyl group, a $C_{2-10}$ alkenyl group, and a $C_{2-10}$ alkynyl group.

8. The electronic device of claim 3, wherein the first repeating unit of Formula (Ia) is selected from the group consisting of:

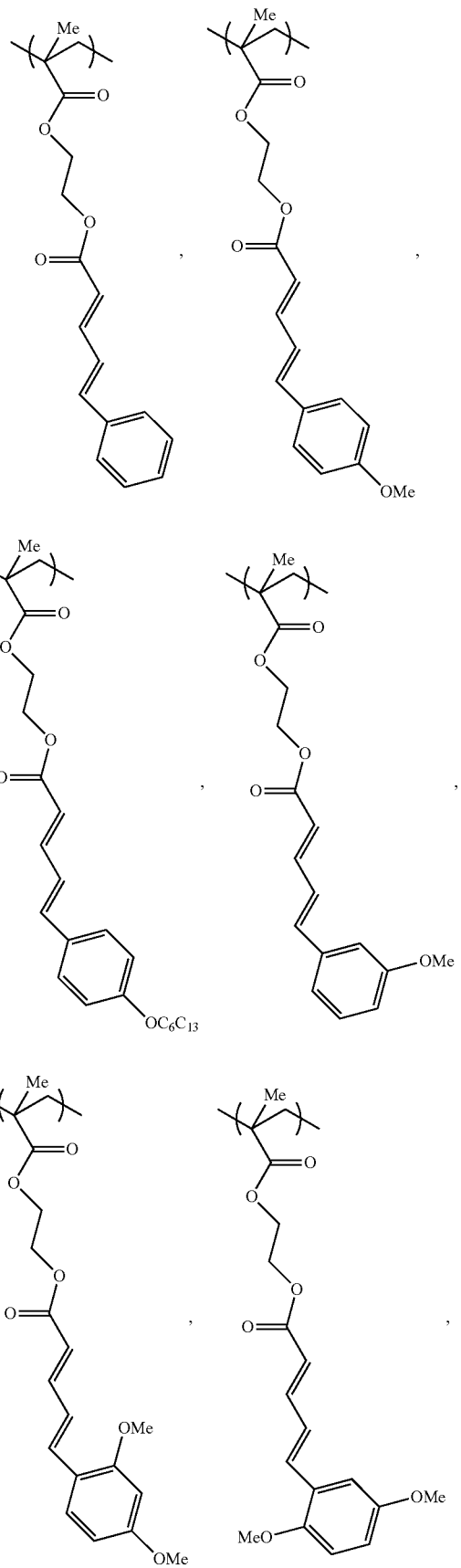

71
-continued
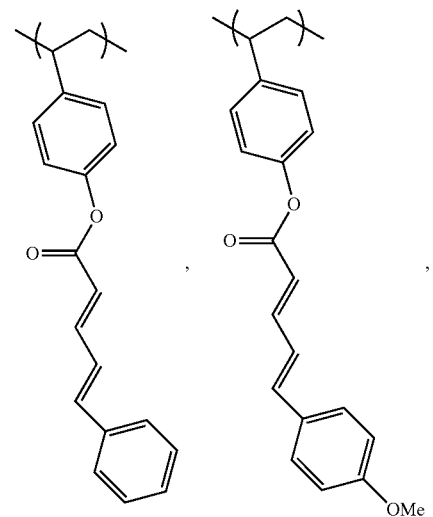
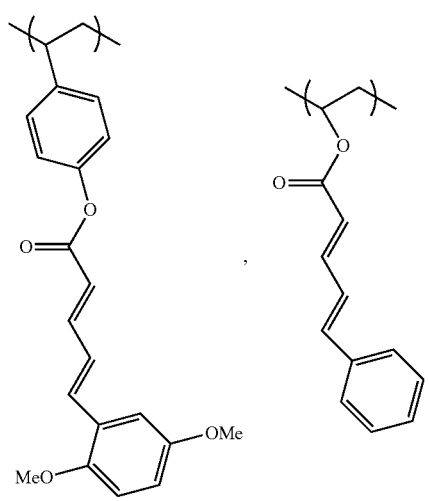
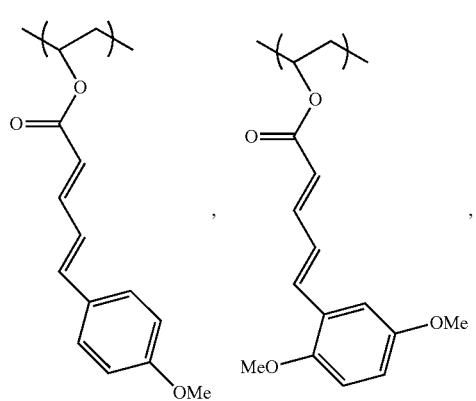
72
-continued
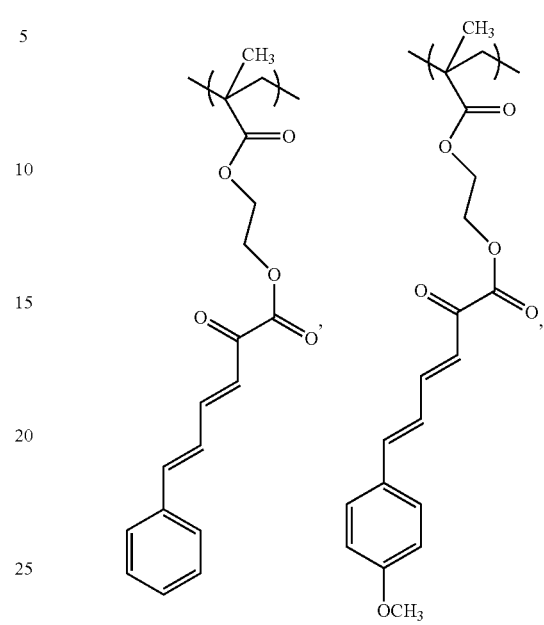
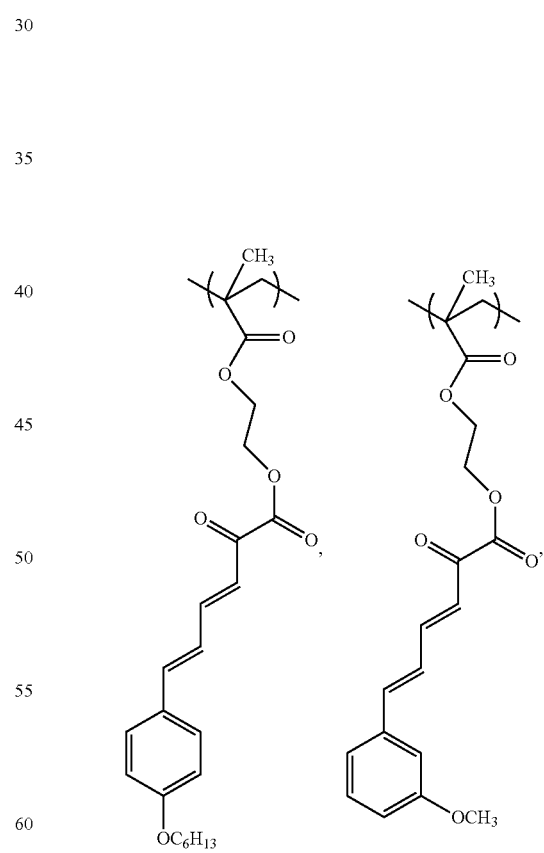

73
-continued
74
-continued
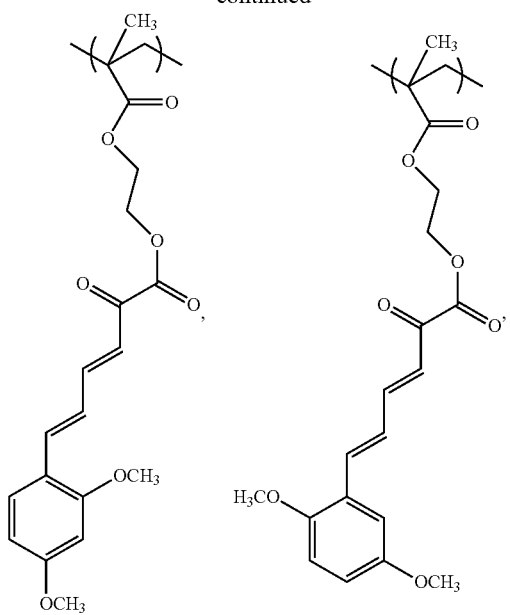
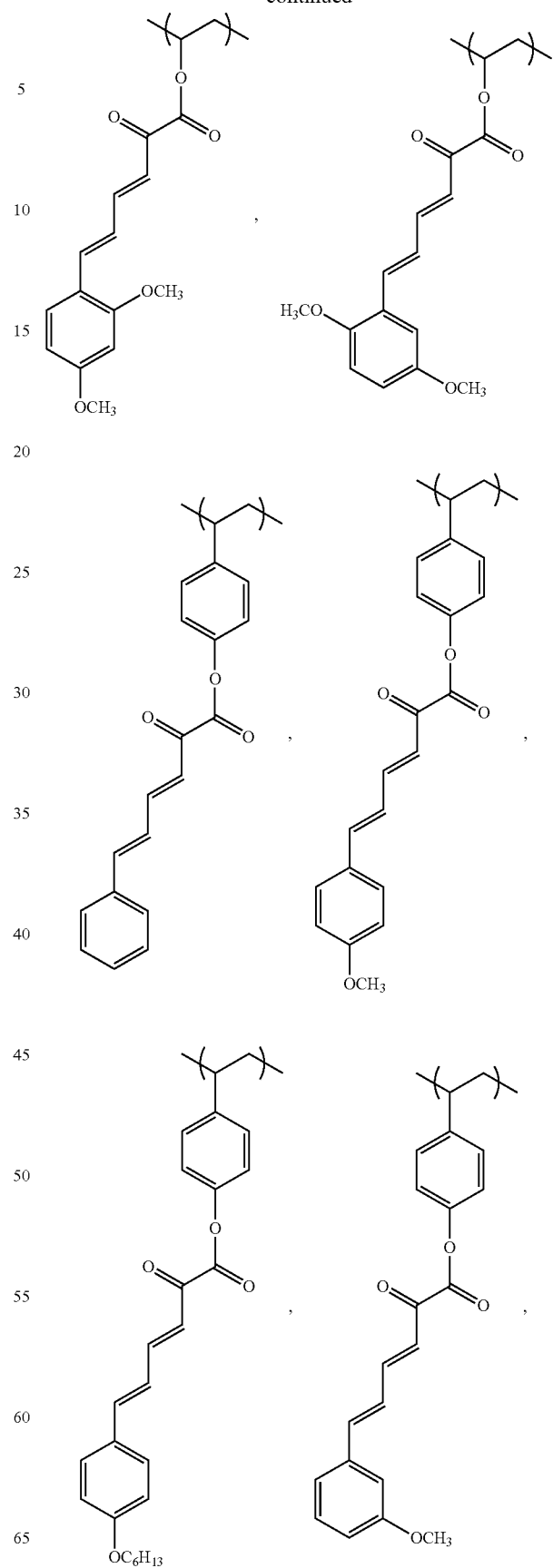

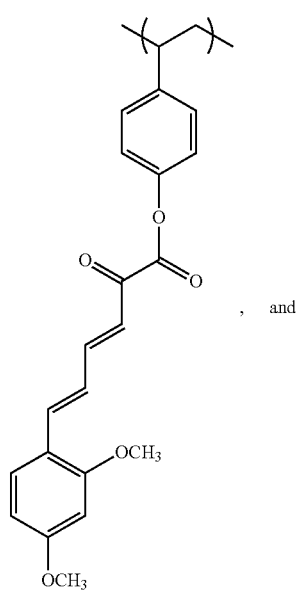
, and

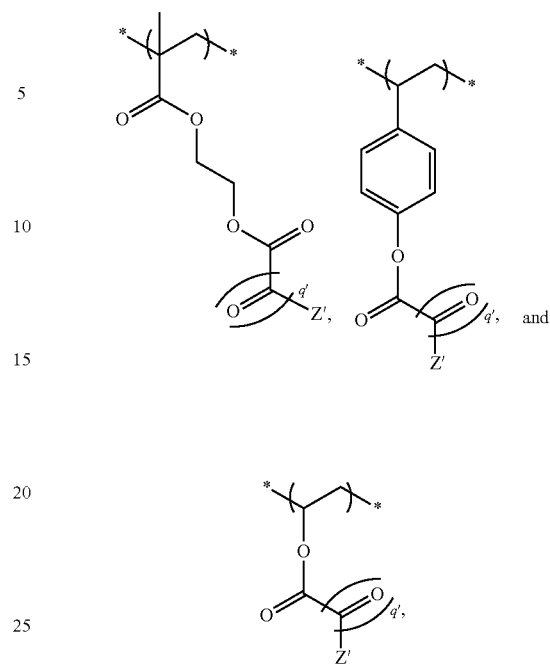
, and wherein Z' is a $C_{1-10}$ alkyl group or a $C_{1-10}$ haloalkyl group.

13. The device of claim 10, wherein the second repeating unit of Formula (Ib) is selected from the group consisting of:

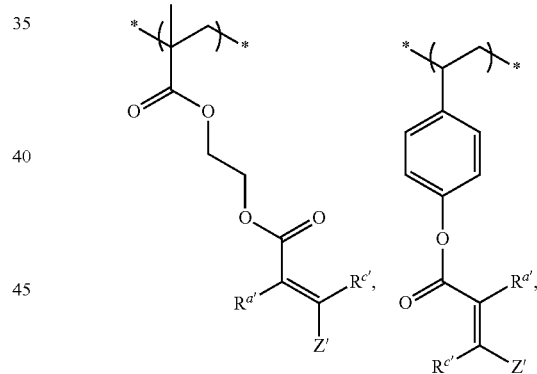

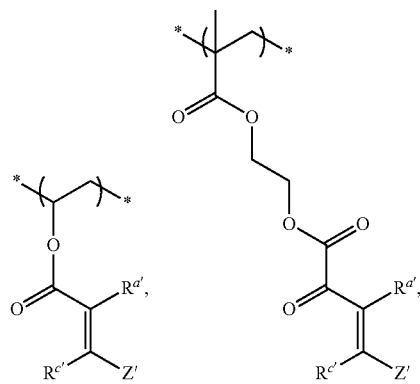

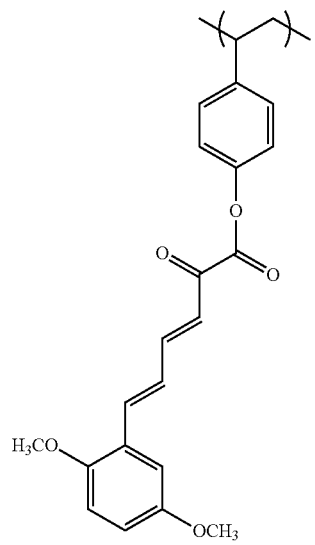

9. The device of claim 1, wherein the polymer is a homopolymer of the first repeating unit of Formula (Ia).

10. The device of claim 1, wherein the polymer is a copolymer of the first repeating unit of Formula (Ia) and the second repeating unit of Formula (Ib).

11. The device of claim 10, wherein L' is absent or selected from the group consisting of —$C_6H_5$—, —Y—, and —C(O)O—Y—, wherein Y is selected from the group consisting of a divalent $C_{1-10}$ alkyl group and a divalent $C_{1-10}$ haloalkyl group.

12. The device of claim 10, wherein the second repeating unit of Formula (Ib) is selected from the group consisting of:

-continued

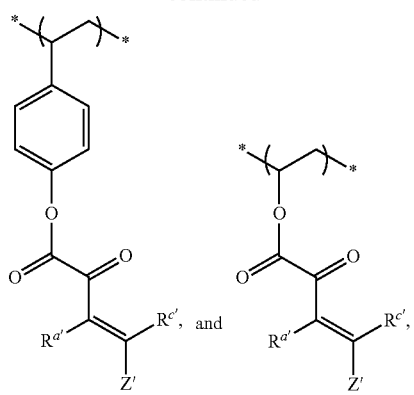

wherein $R^{a'}$ is selected from the group consisting of H, F, and $CH_3$; $R^{c'}$ is selected from the group consisting of H, $CH_3$, and a phenyl group; and Z' is selected from the group consisting of H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group.

14. The electronic device of claim 10, wherein the copolymer has a formula selected from the group consisting of:

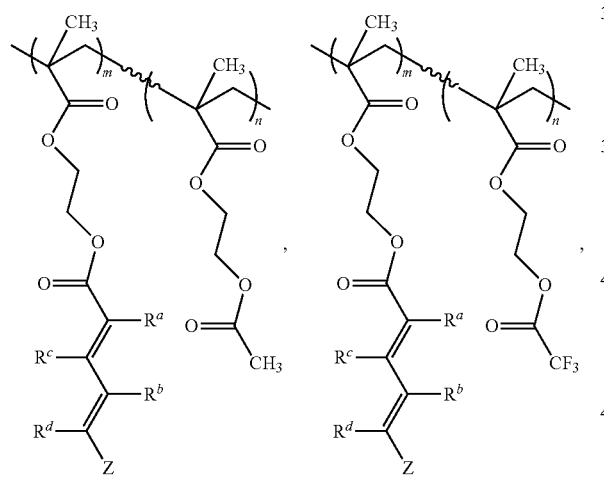

-continued

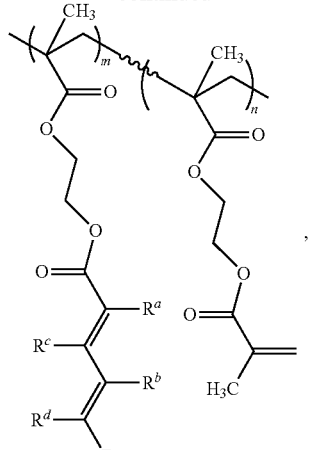

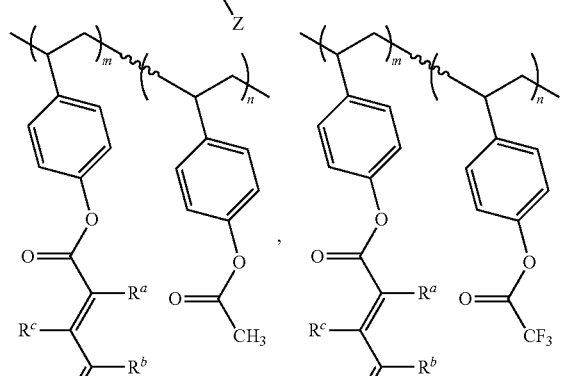

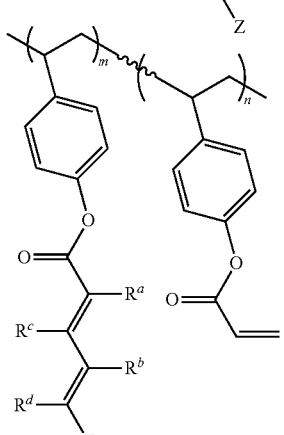

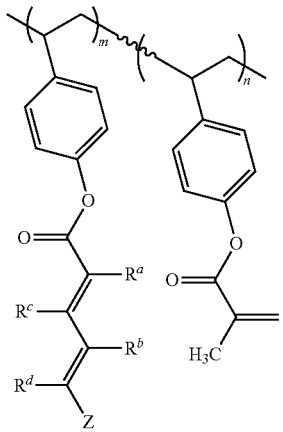

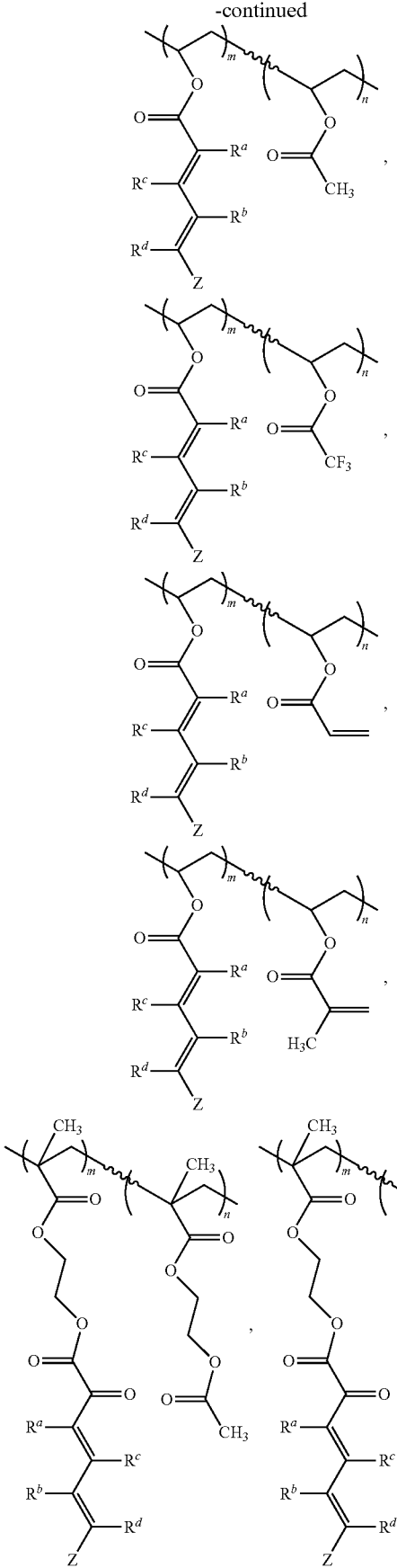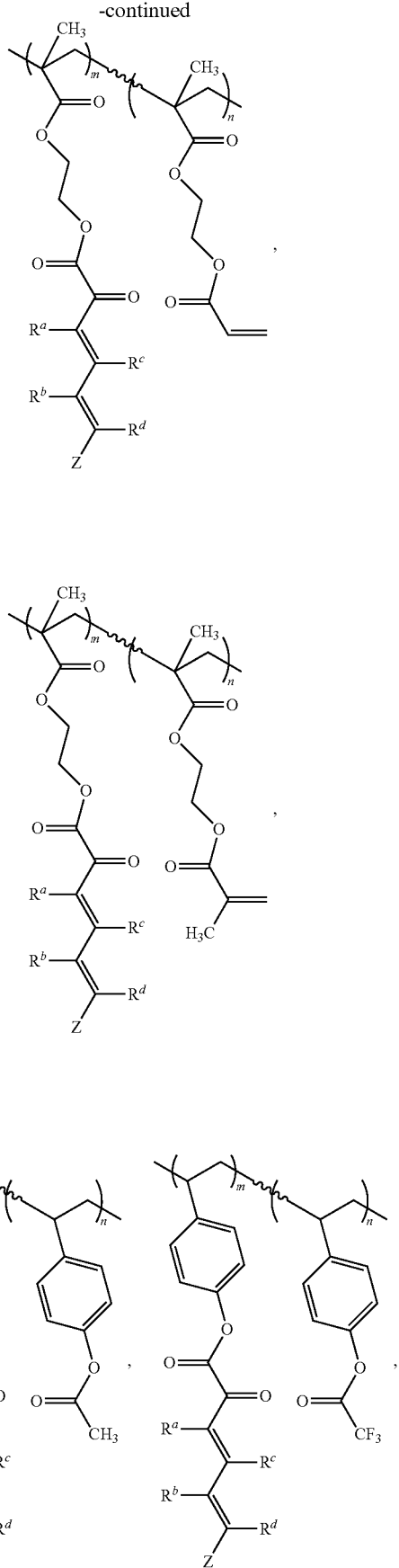

-continued

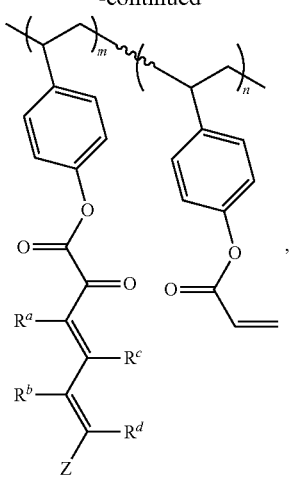

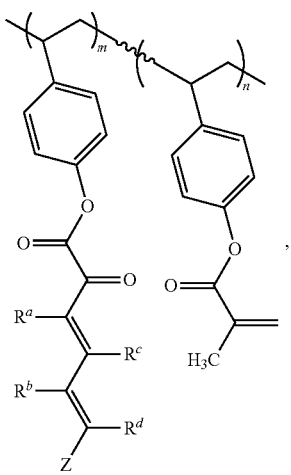

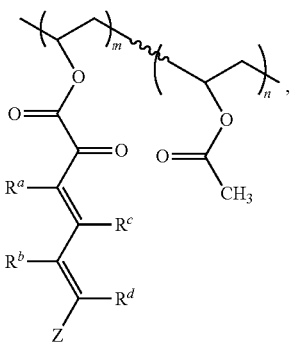

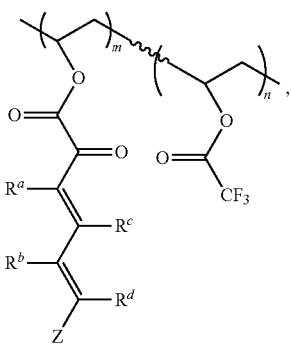

-continued

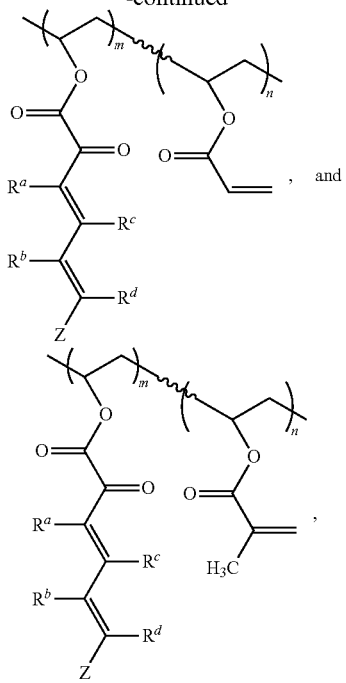

, and

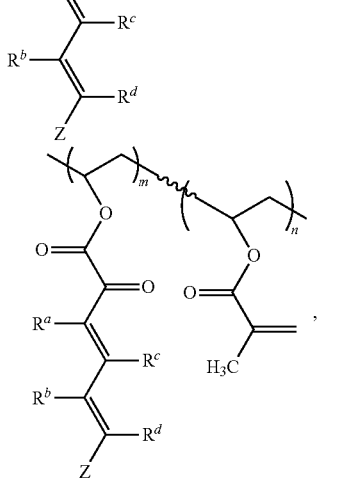

, wherein:

$R^a$ and $R^b$ independently are selected from the group consisting of H, F, and CN;

$R^c$ and $R^d$ independently are selected from the group consisting of H, $CH_3$, and a phenyl group;

Z is a $C_{6-14}$ aryl or 5-14 membered heteroaryl group optionally substituted with 1-5 groups independently selected from the group consisting of a halogen, CN, $R^e$, —O—$R^e$, —S—$R^e$, —C(O)—$R^e$, and —C(O)—O—$R^e$, wherein $R^e$, at each occurrence, is selected from the group consisting of a $C_{1-10}$ alkyl group, a $C_{1-10}$ haloalkyl group, a $C_{2-10}$ alkenyl group, and a $C_{2-10}$ alkynyl group; and m and n independently are a real number, wherein $0<m<1$, $0<n<1$, and m+n=1.

15. The electronic device of claim 14, wherein the copolymer has a formula selected from the group consisting of:

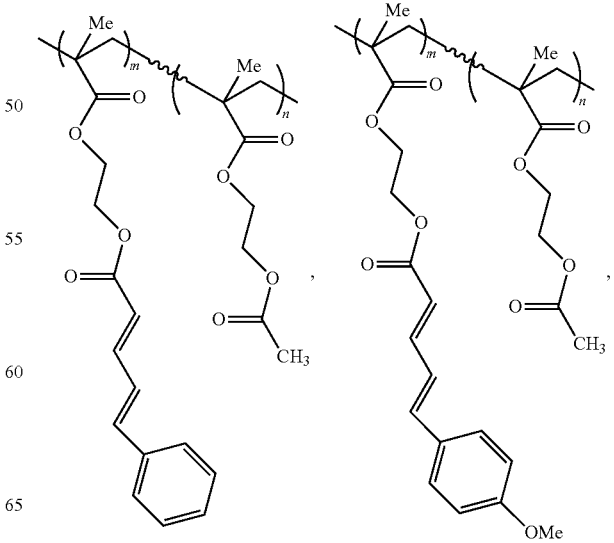

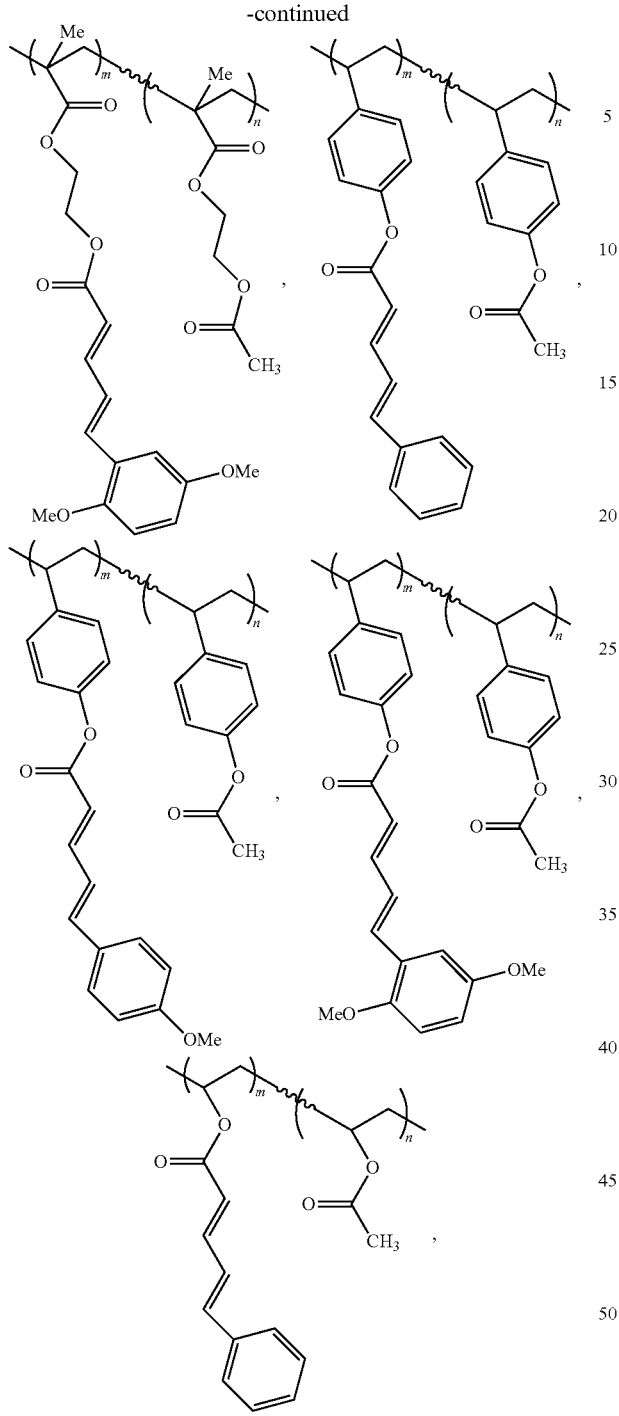

wherein m and n independently are a real number, wherein $0.50 \le m \le 0.99$, $0.01 \le n \le 0.50$, and $m+n=1$.

16. The electronic device of claim 1, wherein the organic material is present in an organic layer coupled to the semiconductor layer, the gate electrode, or the source and drain electrodes, the organic layer functioning as a passivation layer or a surface-modifying layer.

17. The electronic device of claim 1, wherein the field-effect transistor comprises a dielectric layer coupled to the semiconductor layer on one side and the gate electrode on another side, wherein the dielectric layer comprises the organic material.

18. The electronic device of claim 1, wherein the semiconductor layer comprises an organic semiconducting electronic material.

19. The electronic device of claim 1, wherein the semiconductor layer comprises a metal oxide semiconducting electronic material.

20. The electronic device of claim 19, wherein the metal oxide semiconductor material comprises indium-gallium-zinc oxide.

* * * * *